(12) United States Patent
Park et al.

(10) Patent No.: US 10,998,330 B2
(45) Date of Patent: May 4, 2021

(54) SEMICONDUCTOR DEVICE HAVING A PERIPHERAL ACTIVE PATTERN AND METHOD OF MANUFACTURING THE SAME

(71) Applicant: SAMSUNG ELECTRONICS CO., LTD., Suwon-si (KR)

(72) Inventors: Hyunmog Park, Seoul (KR); Daewoong Kang, Seoul (KR); Chadong Yeo, Suwon-si (KR); Jaehoon Jang, Seongnam-si (KR); Joongshik Shin, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/476,044

(22) Filed: Mar. 31, 2017

(65) Prior Publication Data
US 2017/0207234 A1    Jul. 20, 2017

Related U.S. Application Data

(62) Division of application No. 14/460,554, filed on Aug. 15, 2014, now abandoned.

(30) Foreign Application Priority Data

Dec. 5, 2013   (KR) .......................... 10-2013-0150782

(51) Int. Cl.
*H01L 29/04*    (2006.01)
*H01L 27/11573*    (2017.01)
(Continued)

(52) U.S. Cl.
CPC .... *H01L 27/11573* (2013.01); *H01L 27/1157* (2013.01); *H01L 27/11524* (2013.01);
(Continued)

(58) Field of Classification Search
CPC ....................................................... H01L 29/045
(Continued)

(56) References Cited

U.S. PATENT DOCUMENTS 4,791,471 A    12/1988    Onodera et al.
6,225,199 B1    5/2001    Han et al.
(Continued)

FOREIGN PATENT DOCUMENTS

JP    05109984    4/1993
JP    2006010645    1/2008
(Continued)

*Primary Examiner* — Hsin Yi Hsieh
(74) *Attorney, Agent, or Firm* — F. Chau & Associates, LLC

(57) ABSTRACT

A {111} plane of a substrate having a silicon crystal structure meets a top surface of the substrate to form an interconnection line on the top surface. A first stacked structure and a second stacked structure is formed on the substrate. Each of the first and the second stacked structures includes gate electrodes stacked on the substrate. A transistor is disposed on the substrate and positioned between the first stacked structure and the second stacked structure. The transistor includes a gate electrode extending in a first direction, a source region and a drain region. The source and the drain regions are disposed at both sides of the gate electrode in a second direction crossing the first direction. The interconnection line is extended at an angle with respect to the second direction.

19 Claims, 16 Drawing Sheets

(51) Int. Cl.
   *H01L 27/11582* (2017.01)
   *H01L 29/16* (2006.01)
   *H01L 29/49* (2006.01)
   *H01L 27/11575* (2017.01)
   *H01L 27/11524* (2017.01)
   *H01L 27/11529* (2017.01)
   *H01L 27/11556* (2017.01)
   *H01L 27/1157* (2017.01)

(52) U.S. Cl.
   CPC .. *H01L 27/11529* (2013.01); *H01L 27/11556* (2013.01); *H01L 27/11575* (2013.01); *H01L 27/11582* (2013.01); *H01L 29/045* (2013.01); *H01L 29/16* (2013.01); *H01L 29/4966* (2013.01)

(58) Field of Classification Search
   USPC .......................................... 438/198
   See application file for complete search history.

(56) References Cited

U.S. PATENT DOCUMENTS

| | | | |
|---|---|---|---|
| 6,314,548 B1 * | 11/2001 | Suzuki | H01L 22/20 257/E21.525 |
| 6,458,665 B1 | 10/2002 | Kim | |
| 7,186,280 B2 | 3/2007 | Eom et al. | |
| 7,226,506 B2 | 6/2007 | Iida et al. | |
| 7,952,136 B2 | 5/2011 | Kito et al. | |
| 8,084,819 B2 | 12/2011 | Kim et al. | |
| 8,378,414 B2 | 2/2013 | Miller et al. | |
| 2005/0087892 A1 | 4/2005 | Hsu et al. | |
| 2005/0236616 A1 * | 10/2005 | Tseng | H01L 23/544 257/48 |
| 2006/0197161 A1 * | 9/2006 | Takao | H01L 29/7843 257/369 |
| 2008/0001206 A1 | 1/2008 | Gomikawa et al. | |
| 2009/0268524 A1 | 10/2009 | Maejima | |
| 2011/0121403 A1 * | 5/2011 | Lee | H01L 27/11578 257/390 |
| 2015/0162343 A1 | 6/2015 | Park et al. | |
| 2015/0348987 A1 * | 12/2015 | Lee | H01L 27/11573 257/326 |

FOREIGN PATENT DOCUMENTS

| | | |
|---|---|---|
| JP | 2010-70430 | 4/2010 |
| JP | 2010-157734 | 7/2010 |
| KR | 1020060116540 | 11/2006 |
| KR | 1020080001644 | 1/2008 |
| KR | 1020080034816 | 4/2008 |
| KR | 1020100033153 | 3/2010 |
| KR | 10-2011-0087870 | 8/2011 |

* cited by examiner

US 10,998,330 B2

SEMICONDUCTOR DEVICE HAVING A PERIPHERAL ACTIVE PATTERN AND METHOD OF MANUFACTURING THE SAME

CROSS-REFERENCE TO RELATED APPLICATION

This application is a divisional application of U.S. patent application Ser. No. 14/460,554, filed on Aug. 15, 2014, which claims priority under 35 U.S.C. § 119 to Korean Patent Application No. 10-2013-0150782, filed on Dec. 5, 2013 in the Korean Intellectual Property Office, the disclosure of which is incorporated by reference herein in its entirety.

TECHNICAL FIELD

The present disclosure herein relates to a semiconductor device and a method of manufacturing the same.

DISCUSSION OF RELATED ART

Memory cells arranged in three dimensions have been proposed to increase integration density of memory cells. Such three-dimensional arrangement of memory cells may involve vertically stacking. Such stacking may create higher structural stress on a substrate.

SUMMARY

According to an exemplary semiconductor device of the present inventive concept, a {111} plane of a substrate having a silicon crystal structure meets a top surface of the substrate to form an interconnection line on the top surface. A first stacked structure and a second stacked structure is formed on the substrate. Each of the first and the second stacked structures includes a plurality of gate electrodes stacked on the substrate. A transistor is disposed on the substrate and positioned between the first stacked structure and the second stacked structure. The transistor includes a gate electrode extending in a first direction, a source region and a drain region. The source and the drain regions are disposed at both sides of the gate electrode in a second direction crossing the first direction. The interconnection line is extended at an angle with respect to the second direction.

According to an exemplary method of manufacturing a semiconductor device, a device isolation layer defining a peripheral active pattern is formed in a substrate. A peripheral gate electrode crossing the peripheral active pattern is formed in a first direction. Source and drain regions are formed in the peripheral active pattern at both sides of the peripheral gate electrode. The source and drain regions are arranged in a second direction crossing the first direction. A stacked structure is formed on a top surface of the substrate. The stacked structure includes a plurality of gate electrodes vertically stacked on the top surface of the substrate. An intersection line where a {111} plane of the silicon crystal structure and the top surface of the substrate meet is extended at an angle with respect to the second direction.

According to an exemplary semiconductor device, a peripheral circuit structure is disposed on a first substrate having a silicon crystal structure. A {111} plane of the first substrate meets a top surface of the first substrate to form an interconnection line on the top surface. A cell array structure is disposed on the peripheral circuit structure. A second substrate is interposed between the peripheral circuit structure and the cell array structure. The cell array structure includes a plurality of gate electrode stacked on the second substrate. The peripheral circuit structure comprises a transistor having a gate electrode, a source region and a drain region. The gate electrode is extended in a first direction. The source and the drain regions are disposed at both sides of the gate electrode in a second direction crossing the first direction. The intersection line is extended at an angle with respect to the second direction.

BRIEF DESCRIPTION OF THE DRAWINGS

These and other features of the inventive concept will become more apparent by describing in detail exemplary an exemplary embodiment thereof with reference to the accompanying drawings of which.

DETAILED DESCRIPTION OF EXEMPLARY EMBODIMENTS

Figure 1:
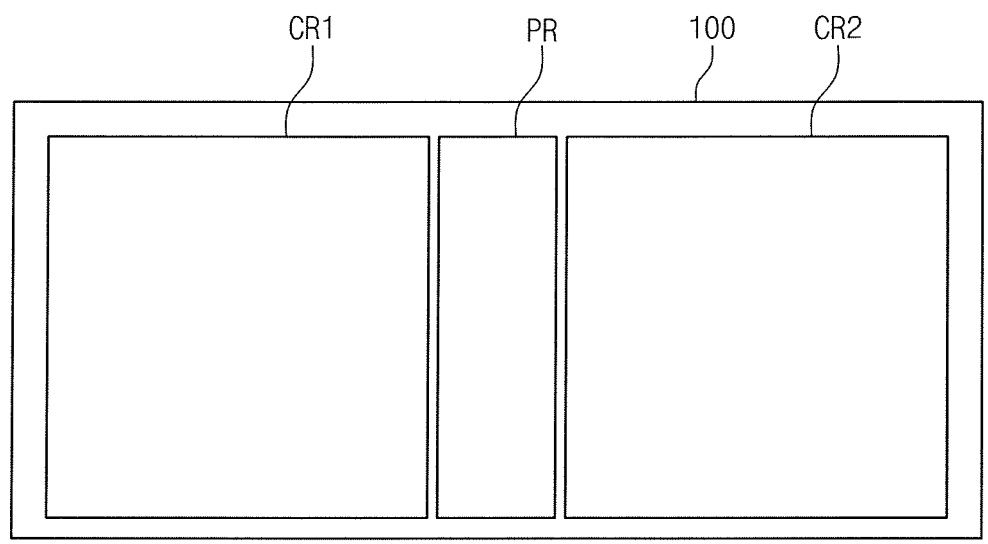
FIG. 1 is a layout of a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a view illustrating a layout of a semiconductor device according to an exemplary embodiment of the inventive concept.

Referring to FIG. 1, a semiconductor substrate 100 includes a cell region and a peripheral region PR. The cell region includes a first cell region CR1 and a second cell region CR2. The first cell region CR1 and the second cell region CR2 are spaced from each other with the peripheral region PR therebetween. Alternatively, the cell regions CR1 and CR2 may be adjacent to each other, and the peripheral region PR may be provided at one side or both sides of the cell regions. The peripheral region PR may be a row decoder region, for example. A memory cell array including memory cells may be arranged in the first and second cell regions CR1 and CR2, and peripheral circuits may be arranged in the peripheral region PR.

Figure 2:
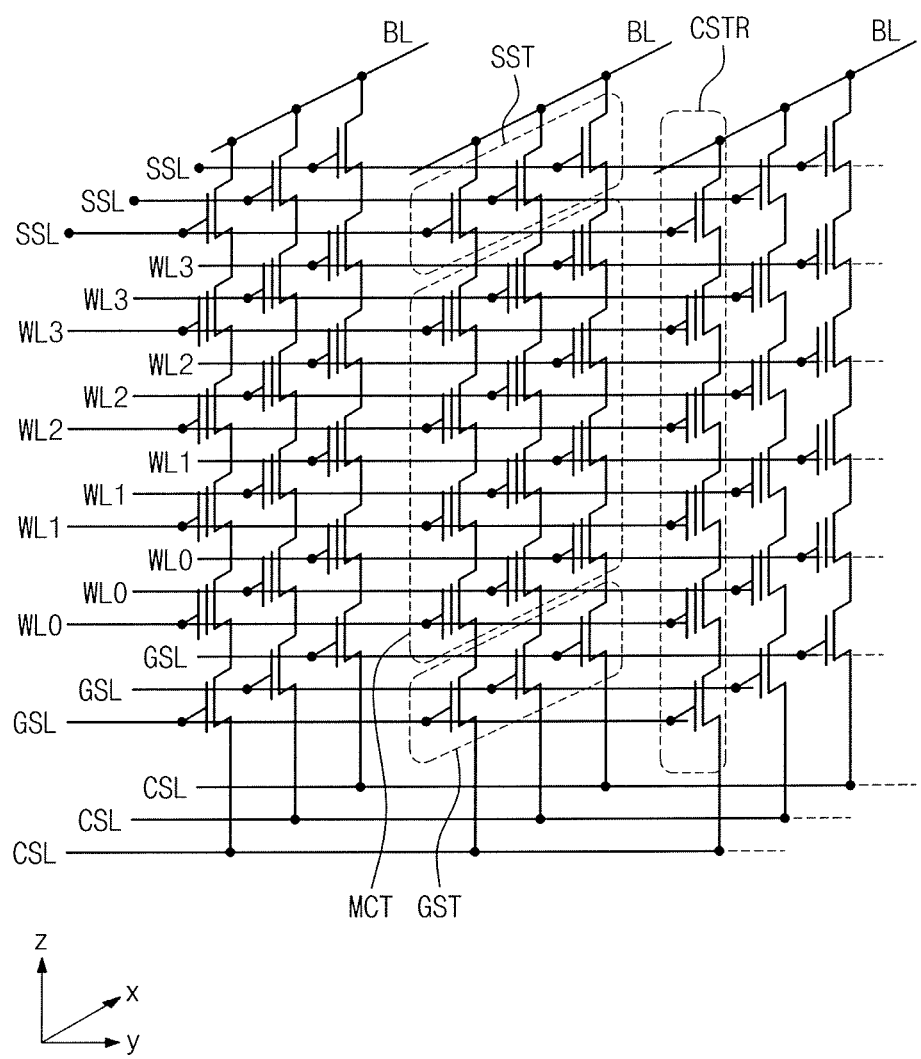
FIG. 2 is a schematic circuit diagram illustrating a cell array of a semiconductor memory device according to an exemplary embodiment of the present inventive concept.

FIG. 2 is a schematic circuit diagram illustrating a cell array of a semiconductor memory device according to an exemplary embodiment of the present invention.

Referring to FIG. 2, the cell array of the semiconductor memory device includes common source lines CSL, bit lines BL, and cell strings CSTR between the common source lines CSL and the bit lines BL.

The common source lines CSL may be a conductive thin film disposed on a substrate or an impurity region formed in a substrate. The bit lines BL may be conductive patterns (e.g., metallic lines) disposed on the substrate, being spaced from the substrate. The bit lines BL are arranged two-dimensionally and the cell strings CSTR are connected in parallel to each of the bit lines BL. The cell strings CSTR may be commonly connected to the common source lines CSL. For example, the cell strings CSTR may be disposed between the bit lines BL and the common source lines CSL. The common source line CSL may be provided in plurality and may be two-dimensionally arranged. The common source lines CSL may be commonly supplied with a voltage. Alternatively, each of the common source lines CSL may be independently supplied with a voltage.

Each of the cell strings CSTR includes a ground selection transistor GST connected to the common source line CSL, a string selection transistor SST connected to the bit line BL, and memory cell transistors MCT between the ground selection transistor GST and the string selection transistor SST. The ground selection transistor GST, the string selection transistor SST, and the memory cell transistors MCT are connected in series to each other.

The common source lines CSL may be commonly connected to sources of the ground selection transistors GST. Furthermore, ground selection lines GSL, word lines WL0 to WL3, and string selection lines SSL, which are disposed between the common source lines CSL and the bit lines BL, serve as gate electrodes of the ground selection transistors GST, the memory cell transistors MCT, and the string selection transistors SST. Additionally, each of the memory cell transistors MCT may include a data storage element.

Figure 3:
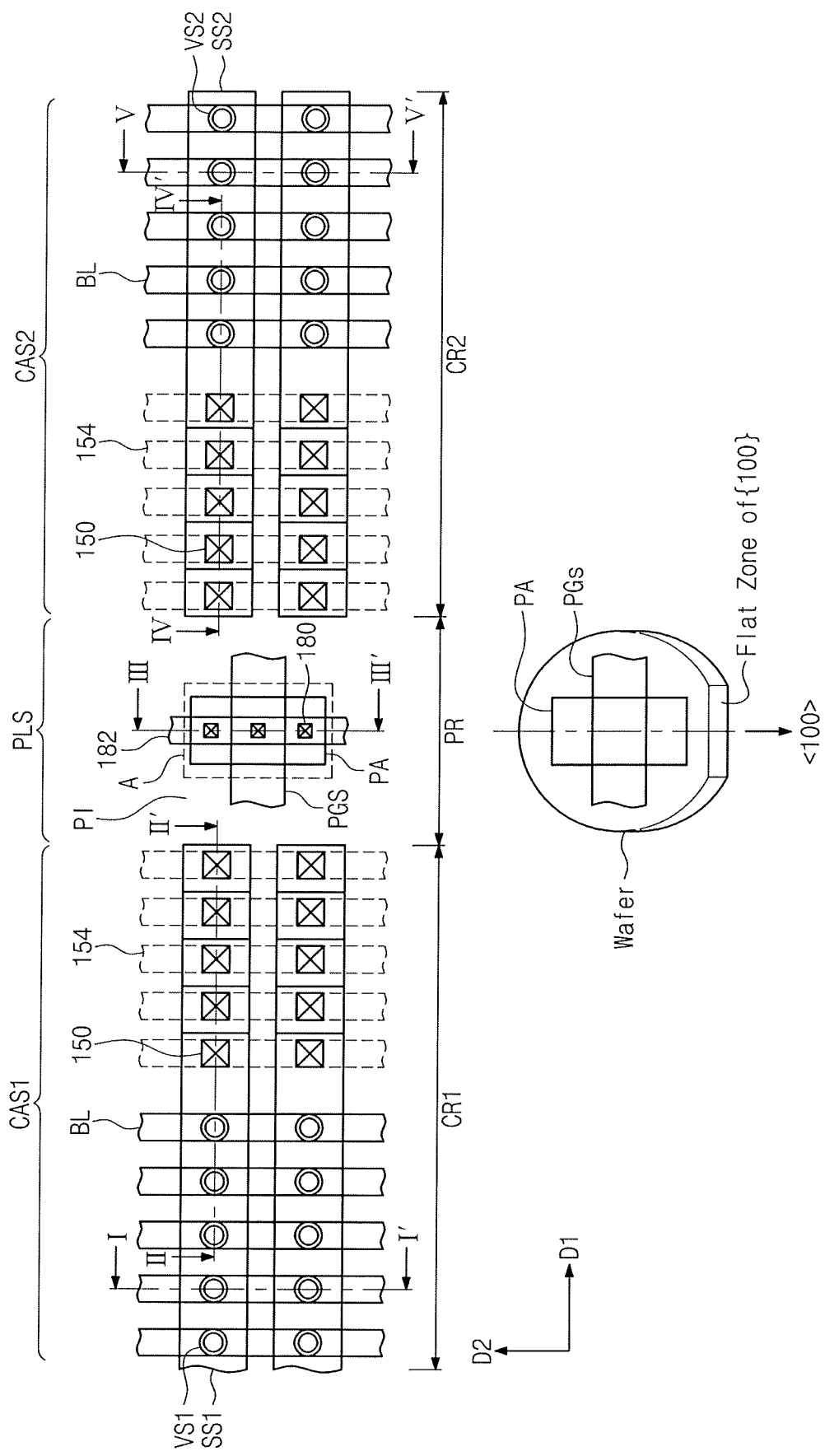
FIG. 3 is a plan view of a semiconductor device according to an exemplary embodiment of the present inventive concept.
Figure 4:
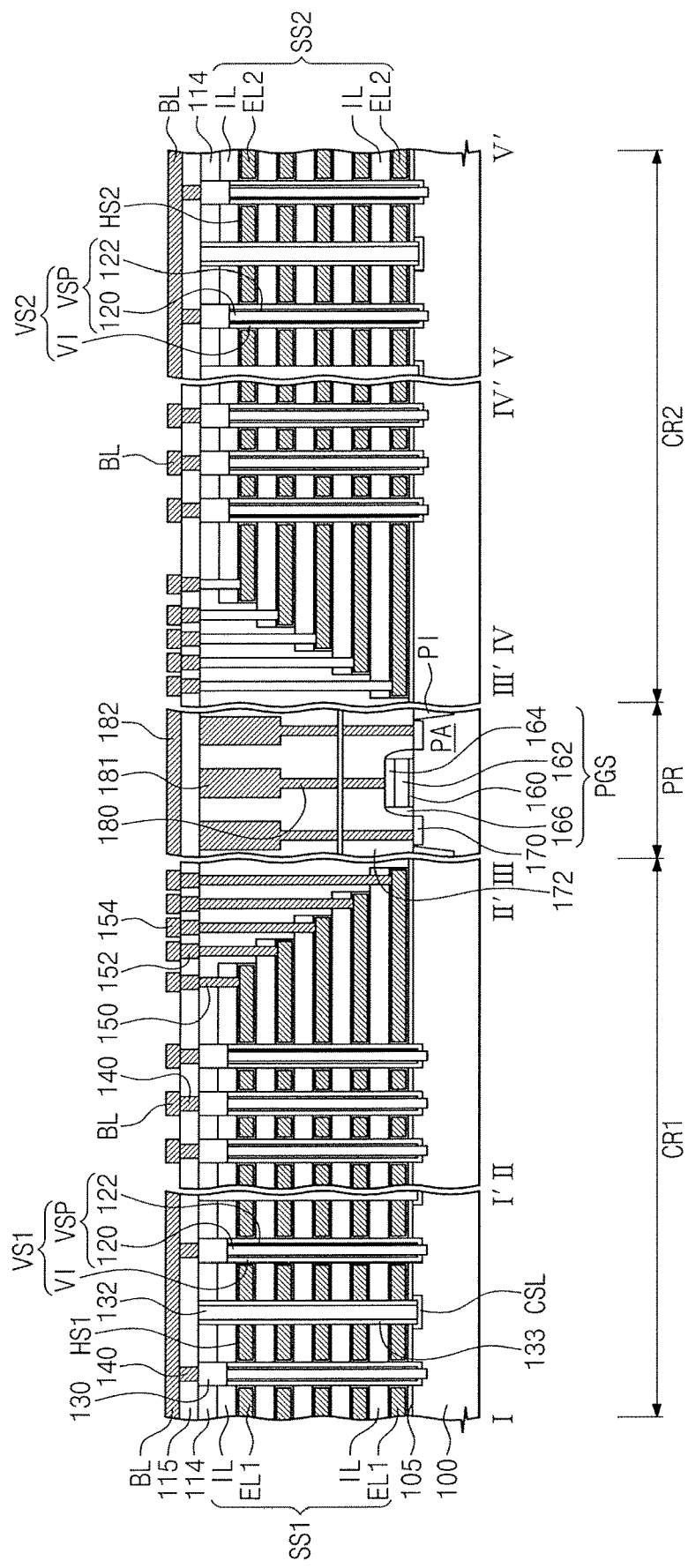
FIG. 4 is a sectional view taken along lines I-I', II-II', III-III', IV-IV', and V-V' of FIG. 3 illustrating a semiconductor device according to an exemplary embodiment of the present inventive concept.
Figure 5:
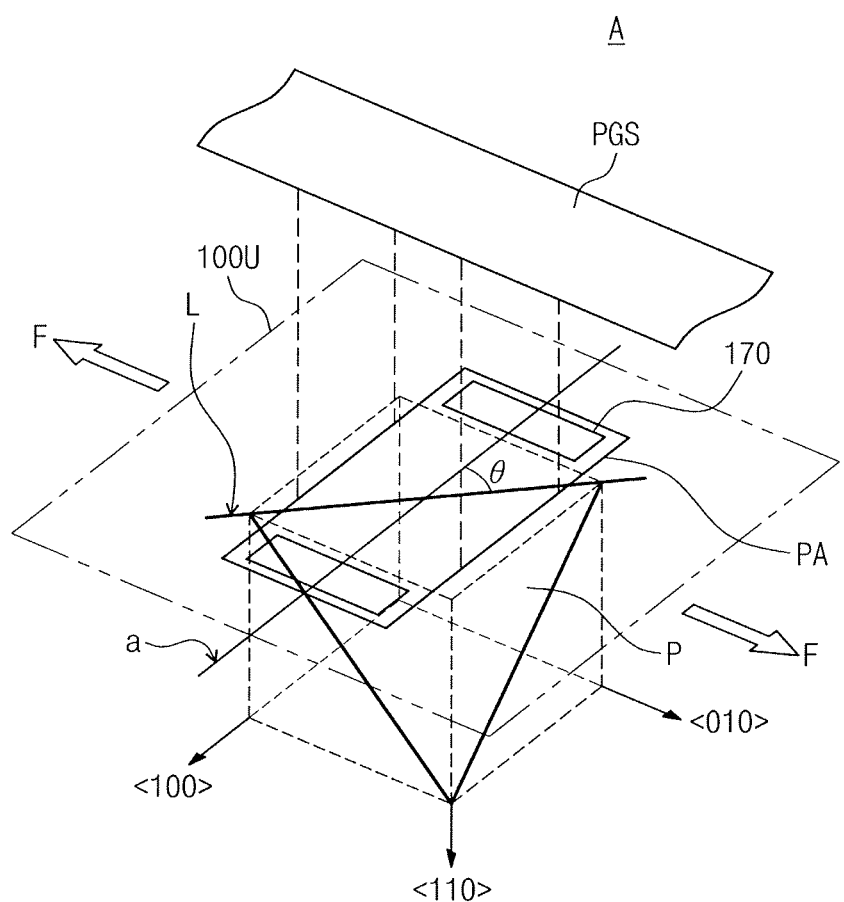
FIG. 5 is a conceptual view illustrating a portion A of FIG. 3.

FIG. 3 is a plan view of a semiconductor device according to an exemplary embodiment of the inventive concept. FIG. 4 is a sectional view taken along lines I-I', II-II', III-III', IV-IV', and V-V' of FIG. 3 according to an exemplary embodiment of the inventive concept. FIG. 5 is a conceptual view illustrating a portion A of FIG. 3.

Referring to FIGS. 3 and 4, the semiconductor substrate 100 includes a first cell region CR1, a second cell region CR2, and a peripheral region PR therebetween. The semiconductor substrate 100 may be a silicon substrate.

A first cell array structure CAS1 may be disposed in the first cell region CR1 and a second cell array structure CAS2 may be disposed in the second cell region CR2. A peripheral logic structure PLS may be disposed in the peripheral region PR. The first cell array structure CAS1 and the second cell array structure CAS2 may have structures symmetric to each other with respect to the peripheral region PR.

The first cell array structure CAS1 may include a first stacked structure SS1 and a first vertical structure VS1. The first stacked structure SS1 includes insulating layers IL and first gate electrodes EL1 that are alternately and repeatedly stacked on the semiconductor substrate 100. The first vertical structure VS1 penetrates the first stacked structure SS1 toward the substrate 100.

The first stacked structure SS1 is line-shaped, extending in a first direction D1. The first stacked structure SS1 may have a stepped structure for electrical connections between the first gate electrodes EL1 and the peripheral logic structure PLS. Thicknesses of the insulating layers IL may be substantially identical to each other. Alternatively, at least one insulating layer IL may be different in thickness from the other insulating layers IL. End portions of the first gate electrodes EL1 form a stepped structure. For example, the end portions of the first gate electrodes EL1 are further extended toward the peripheral region PR as the first gate electrodes EL1 become closer to the top surface of the semiconductor substrate 100. Accordingly, sidewalls of the first gate electrodes EL1 toward the peripheral region PR may be disposed in different horizontal positions along the first direction D1.

The first vertical structure VS1 penetrates the first stacked structure SS1 to be connected to the semiconductor substrate 100. The first vertical structure VS1 includes a vertical semiconductor pattern VSP and a vertical insulator VI. The vertical semiconductor pattern VSP penetrates the first stacked structure SS1 to be electrically connected to the semiconductor substrate 100. The vertical insulator VI is disposed between the vertical semiconductor pattern VSP and the first stacked structure SS1. First vertical structures VS1, when viewed from the above, are arranged in a straight line along the first direction D1 as shown in FIG. 3. Alternatively, the first vertical structures VS1, when viewed from the above, may be arranged in a zigzag form along the first direction D1.

The vertical semiconductor pattern VSP includes a first semiconductor pattern 122 and a second semiconductor pattern 120. The first semiconductor pattern 122 is disposed on an inner wall of the first stacked structure SS1. The first semiconductor pattern 122 may be pipe-shaped or macaroni-shaped having open top and bottom ends. The first semiconductor pattern 122 is spaced from the semiconductor substrate 100 without being in contact with the semiconductor substrate 100. The second semiconductor pattern 120 may pillar-shaped, filling the inside of the vertical semiconductor pattern VSP. The second semiconductor pattern 120 is disposed on the inner wall of the first semiconductor pattern 122 and the semiconductor substrate 100. The bottom surface of the second semiconductor pattern 120 is positioned to be lower than the top surface of the semiconductor substrate 100. For example, the second semiconductor pattern 120 is partly inserted into the semiconductor substrate 100. The second semiconductor pattern may electrically connect the first semiconductor pattern 122 and the semiconductor substrate 100.

The first and second semiconductor patterns 122 and 120 may include a semiconductor material. For example, the first and second semiconductor patterns 122 and 120 may include Si, Ge, or a mixture thereof, or may be a semiconductor doped with an impurity or an intrinsic semiconductor. Additionally, the first and second semiconductor patterns 122 and 120 may have at last one of single-crystal, amorphous, and polycrystalline structures.

The vertical insulator VI is disposed between the first stacked structure SS1 and the vertical semiconductor pattern VSP. The vertical insulator VI may pipe-shaped or macaroni-shaped having open top and bottom ends. The first semiconductor pattern 122 is spaced from the semiconductor substrate 100 by the bottom part of the vertical insulating layer VI.

The vertical insulator VI may include a memory element of a flash memory device. For example, the vertical insulator VI may include a charge storage layer of a flash memory device. Alternatively, the vertical insulator VI may include a charge storage layer and a tunnel insulating layer, which are stacked sequentially. The tunnel insulating layer may directly contact the vertical semiconductor pattern VSP and the charge storage layer may be disposed between the tunnel insulating layer and the first gate electrodes EL1. Alternatively, the vertical insulator VI may further include a blocking insulating layer disposed between the charge storage layer and the first gate electrodes EL1.

The charge storage layer may include at least one of a silicon nitride layer, a silicon oxynitride layer, a Si-rich nitride layer, a nanocrystalline Si layer, and a laminated trap layer. The tunnel insulating layer may include a material having an energy band gap greater than that of the charge storage layer. For example, the tunnel insulating layer may be a silicon oxide layer. The blocking insulating layer may include a material having an energy band gap greater than that of the charge storage layer. For example, the blocking insulating layer may be a silicon oxide layer, a silicon nitride layer, and/or a silicon oxynitride layer.

The first cell array structure CAS1 further includes first horizontal structures HS1. The first horizontal structures HS1 are disposed between the first gate electrodes EL1 and the insulating layers IL, and between the first gate electrodes EL1 and the vertical insulator VI. The first horizontal structures HS1 are not connected to each other. The inventive concept is not limited thereto, and the first horizontal structures HS1 may connected to each other in a sinuous manner. In this case, the first horizontal structures HS1 may be further disposed between the insulating layers IL and electrode patterns 132. The electrode patterns 132 will be described below. The first horizontal structures HS1 may be formed of at least one thin film layer. For example, the first horizontal structures HS1 may include a blocking insulating layer of a charge trap type flash memory transistor.

Common source regions CSL are disposed between two adjacent first stacked structures SS1 on the semiconductor substrate 100. The common source regions CSL may be line-shaped extending in the first direction D1. The common source regions may be arranged along a second direction intersecting the first direction D1. For example, the common source regions and the first stacked structures SS1 may be alternately arranged along the second direction.

A lower insulating layer 105 is disposed between the semiconductor substrate 100 and the first stacked structure SS1. For example, the lower insulating layer 105 may be a silicon oxide layer. The lower insulating layer 105 may be thinner than the insulating layers IL.

A conductive pad 130 penetrates the first stacked structure SS1 to be connected to the first vertical semiconductor pattern VSP1. The conductive pad 130 may be an impurity region doped with an impurity or may include a conductive material.

Electrode patterns 132 may be disposed between two adjacent first stacked structures SS1. The electrode patterns 132 are disposed on the common source regions CSL. Alternatively, the electrode patterns 132 may be a portion of the common source regions CSL. The electrode patterns 132 may include a metal layer or a metal-silicide layer. Insulating spacers 133 are disposed between the electrode patterns 132 and the first gate electrodes EL1. As such, the electrode patterns 132 are electrically insulated from the first gate electrodes EL1 by the insulating spacers 133. The insulating spacers 133 may include at least one of a silicon oxide layer, a silicon nitride layer, and a silicon oxynitride layer.

The second cell array structure CAS2 includes a second stacked structure SS2 where insulating layers IL and second gate electrodes EL2 are alternately and repeatedly stacked on the semiconductor substrate 100 and a second vertical structure VS2 penetrating the second stacked structure SS2.

The second stacked structure SS2 may be line-shaped extending in the first direction D1, and may have a stepped structure for electrical connections between the second gate electrodes EL2 and the peripheral logic structure PLS. For example, end portions of the second gate electrodes EL2 have a stepped structure. For example, the end portions of the second gate electrodes EL2 are further extended toward the peripheral region PR as the second gate electrodes EL2 become closer to the top surface of the semiconductor substrate 100. Accordingly, sidewalls of the second gate electrodes EL2 toward the peripheral PR may be disposed in different horizontal positions along the first direction.

The second vertical structure VS2 penetrates the second stacked structure SS2 to be connected to the semiconductor substrate 100. The second vertical structure VS2 may include substantially the same structure as the first vertical structure VS1. The second vertical structures VS2, when viewed from the above, are arranged in a straight line along the first direction D1 as shown in FIG. 3. Alternatively, the second vertical structures VS2, when viewed from the above, may be arranged in a zigzag form along the first direction D1.

The second cell array structure CAS2 includes second horizontal structures HS2. The second horizontal structures HS2 are disposed between the second gate electrodes EL2 and the insulating layers IL, and between the second gate electrodes EL2 and the vertical insulator VI. The second horizontal structures HS2 may have substantially the same configuration as the first horizontal structure HS1.

Other elements of the first cell region CR1 are included in the second cell region CR2. For example, common source regions CSL in the second cell region CR2 are disposed between two adjacent second stacked structures SS2 on the semiconductor substrate 100. a lower insulating layer 105 of the second cell region CR2 may be disposed between the semiconductor substrate 100 and the second stacked structure SS2. A conductive pad 130 of the second cell region CR2 may penetrate the second stacked structure SS2 to be connected to the second vertical semiconductor pattern VSP2. Electrode patterns 132 of the second cell region CR2 may be disposed between two adjacent second stacked structures SS2.

The peripheral logic structure PLS may include N-type Metal Oxide Semiconductor (NMOS) and/or P-type Metal Oxide Semiconductor (PMOS) transistors electrically connected to the cell array structures CAS1 and/or CAS2. For example, a device isolation layer PI defining a peripheral active pattern PA is disposed on the semiconductor substrate 100 in the peripheral region PR. The peripheral logic structure PLS includes a peripheral gate structure PGS extending in the first direction D1, as crossing the peripheral active pattern PA, source and drain regions 170 formed in the peripheral active pattern PA at both sides of the peripheral gate structure PGS, and a peripheral insulating pattern 172 covering the peripheral gate structure PGS and the source and drain regions 170. The peripheral gate structure PGS includes a gate dielectric pattern 160, a peripheral gate electrode 162, and a peripheral capping pattern 164, which are sequentially stacked on the semiconductor substrate 100. The peripheral gate structure PGS further includes a gate spacer 166 on both sidewalls of the peripheral gate electrode 162.

Referring to FIG. 5, the peripheral active pattern PA is formed on a straight line parallel to a reference axis a of the second direction D2. The semiconductor substrate 100 may include a silicon crystal structure. The reference axis a of the peripheral active pattern PA, when viewed from the above, intersects at an oblique angle θ with an intersection line L where a {111} plane P of the silicon crystal structure meets with a top surface 100U of the semiconductor substrate 100. The oblique angle θ between the reference axis a of the peripheral active pattern PA and the intersection line L may be greater than 0° and be less than or equal to about 45°. The oblique angle θ may include an angle error of ±1° which may occur when a wafer is formed. The source and drain regions 170 formed in the peripheral active pattern PA is spaced from each other along the second direction D2.

While each of the stacked structures SS1 and SS2 is formed on the semiconductor substrate 100 of the cell regions CR1 and CR2, a tensile stress F may be applied to the semiconductor substrate 100 in the peripheral region PR. The tensile stress F may result from layers that are vertically stacked on the semiconductor substrate 100 in the cell regions CR1 and CR2. When the tensile stress F is applied to the semiconductor substrate 100 in the peripheral area PR, bonding between silicon atoms on a {111} plane P of the silicon crystal structure may be broken. For example, dangling bond between silicon atoms on the {111} plane P may be formed and electrons may move easily through the dangling bond.

From a planar point of view, when one pair of source and drain regions 170 formed in one peripheral active pattern PA is disposed on the intersection line L and thus the source and drain regions 170 are connected to each other by the intersection line L, a current path connecting the source and drain regions 170 may occur along the intersection line L by the dangling bond between silicon atoms on the {111} surface P. Accordingly, leakage current may occur between the source and drain regions 170.

According to an embodiment of the inventive concept, the one pair of source and drain regions 170 formed in one peripheral active pattern PA may be disposed on the reference axis a from a planar point of view and the reference axis a of the peripheral active pattern PA may form an oblique angle with the intersection line L. For example, the source and drain regions 170 may not be connected to each other by the intersection line L. Accordingly, even when dangling bond between silicon atoms on the {111} plane P is formed, a current path connecting the source and drain regions 170 may not occur. Accordingly, a semiconductor device having reduced leakage current may be provided.

Referring back to FIGS. 3 and 4, a buried insulating layer 114 covering the cell array structures CAS1 and CAS2 and the peripheral logic structure PLS is disposed on the semiconductor substrate 100. The buried insulating layer 114 includes a planarized top surface, covering the end portions of the first and second stacked structures SS1 and SS2. An interlayer insulating layer 115 is disposed on the buried insulating layer 114.

Bit lines BL crossing each of the stacked structures SS1 and SS2 and extending in the second direction D2 are disposed on the interlayer insulating layer 115 in the cell regions CR1 and CR2. The bit lines BL are electrically connected to the vertical structures VS1 and VS2 through bit line contact plugs 140.

Furthermore, a wiring structure that electrically connects the cell array structures CAS1 and CAS2 and the peripheral logic structure PLS may be disposed on the interlayer insulating layer 115 in the cell regions CR1 and CR2. For example, cell plugs 150 penetrate the buried insulating layer 114 to be connected to the end portions of the gate electrodes EL1 and EL2. As the cell plugs 150 are closer to the peripheral region PR, the vertical length of the cell plugs 150 increase. Cell connection lines 154, disposed on the interlayer insulating layer 115, are electrically connected to the cell plugs 150 through cell contacts 152. The cell contacts 152 penetrates the interlayer insulating layer 115 to connect the cell plugs 150 and the cell connection lines 154.

A peripheral wire 182 is disposed on the interlayer insulating layer 115 in the peripheral region PR. The peripheral wire 182 may be provided in plurality. The peripheral wires 182 may be electrically connected to the peripheral gate structure PGS and the source and drain regions 170 through peripheral contact plugs 180 and peripheral contact pads 181 penetrating the buried insulating layer 114.

FIGS. 6 to 9 are sectional views taken along lines I-I', II-II', and III-III' of FIG. 3 and illustrate a method of manufacturing a semiconductor device according to an exemplary embodiment of the inventive concept.

Figure 6:
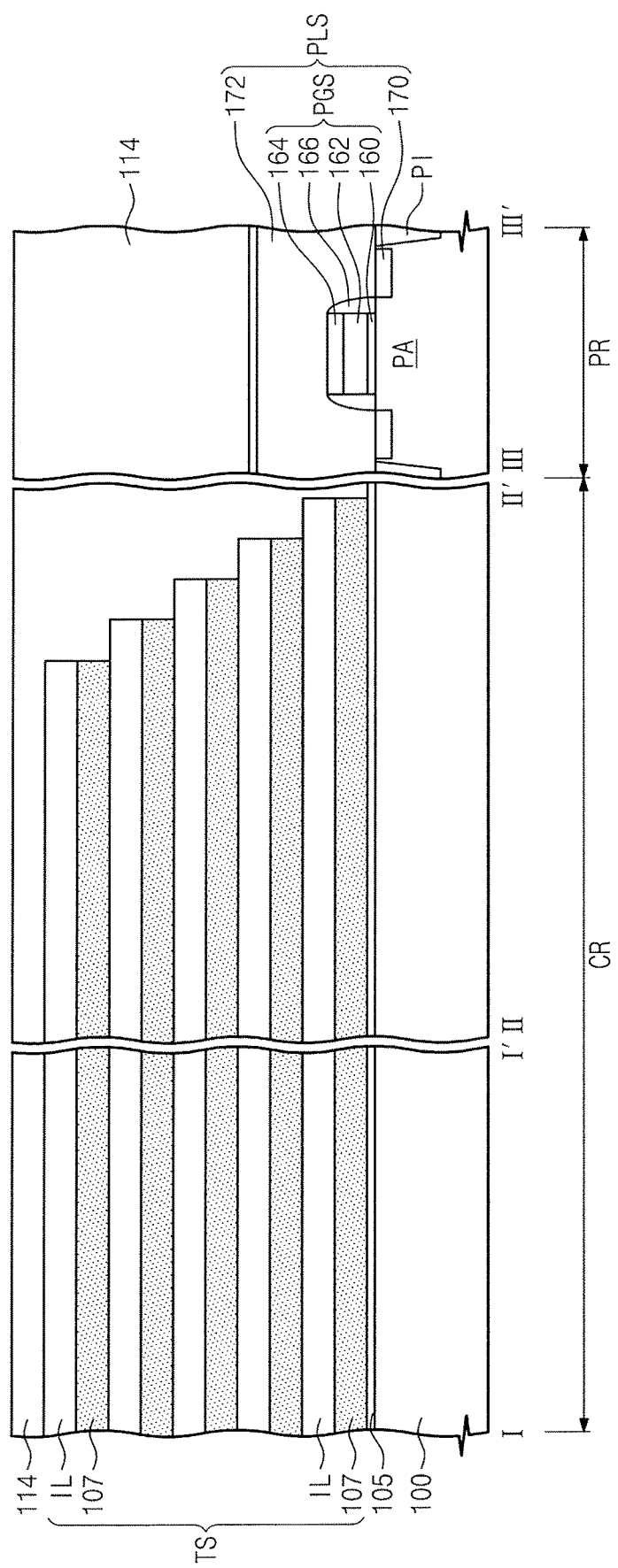
FIGS. 6 to 9 are sectional views taken along lines I-I', II-II', III-III' of FIG. 3 illustrating a method of manufacturing a semiconductor device according to an exemplary embodiment of the present inventive concept.

Referring to FIG. 6, a semiconductor substrate 100 having a silicon crystal structure may be provided. For example, the semiconductor substrate 100 may be a silicon wafer. The semiconductor substrate 100 may have a flat zone formed on a {100} plane of a silicon crystal structure, as shown in FIG. 3. However, the semiconductor substrate 100 may have a flat zone formed on a {110} plane of a silicon crystal structure. This case will be described with reference to FIG. 10.

The semiconductor substrate 100 includes a cell region CR and a peripheral region PR. A device isolation layer PI defining a peripheral active pattern PA is formed on the semiconductor substrate 100 in the peripheral region PR. As shown in FIGS. 3 and 5, the peripheral active pattern PA is extended along the reference axis a that is in parallel to the second direction D2. The peripheral gate structure PGS is extended in the first direction D1 crossing the second direction D2. In this case, source/drain regions 170 are disposed at both sides of the peripheral gate structure PGS along the reference axis a. The reference axis a may be in parallel to a <100> direction of the semiconductor substrate 100.

The reference axis a, as described with reference to FIG. 5, crosses at an oblique angle θ the intersection line L where the {111} plane P meets the top surface 100U of the {100} plane in the semiconductor substrate 100. In this case, the intersection line L has a <110> crystallographic direction, and thus the oblique angle between the reference axis a and the intersection line L is about 45°. The inventive concept is not limited thereto, and the oblique angle θ may be greater than about 1° and less than about 45°. The oblique angle θ may include an angle error of ±1° which may occur when a wafer is formed.

The peripheral gate structure PGS crossing the peripheral active pattern PA and extending in the first direction D1 perpendicular to the second direction D2 is formed on the semiconductor substrate 100 in the peripheral area PR. The forming of the peripheral gate structure PGS may include sequentially stacking a peripheral gate dielectric layer, a peripheral gate electrode layer, and a peripheral capping layer on the semiconductor substrate 100 and forming a peripheral gate dielectric pattern 160, a peripheral gate electrode 162, and a peripheral capping pattern 164 by patterning the peripheral capping layer, the peripheral gate electrode layer, and the peripheral gate dielectric layer. The forming of the peripheral gate structure PGS further includes forming a peripheral gate spacer 166 on both sidewalls of the peripheral gate electrode 162. The peripheral gate electrode 162 may include poly silicon doped with an impurity or a metallic material. The peripheral gate dielectric pattern 160 may include silicon oxide formed by a thermal oxidation process. The peripheral capping pattern 164 may include silicon nitride, for example, and the peripheral gate spacer 166 may include silicon oxide and/or silicon nitride.

Source and drain regions 170 are formed in the peripheral active pattern PA at both sides of the peripheral gate structure PGS. The forming of the source and drain regions 170 may include injecting an impurity onto the semiconductor substrate 100 at both sides of the peripheral gate structure PGS. For example, the source and drain regions 170 are arranged along the reference axis a of the peripheral active pattern PA that is in parallel to the second direction D2. Accordingly, the source and drain regions 170 need not be arranged in parallel to a direction where the intersection line L is extended.

A peripheral insulating pattern 172 covering the peripheral gate structure PGS and the source and drain regions 170 is formed on the semiconductor substrate 100 in the peripheral region PR. The peripheral insulating pattern 172 may be formed of a silicon oxide, for example. The peripheral gate structure PGS, the source and drain regions 170, and the peripheral insulating pattern 172 constitutes a peripheral logic structure PLS.

A thin film structure TS where sacrificial layers 107 and insulating layers IL are alternately and repeatedly deposited is formed on the semiconductor substrate 100 in the cell region CR.

The sacrificial layers 107 may be formed of a material having etch selectivity with respect to the insulating layers IL. According to an embodiment of the inventive concept, the sacrificial layers 107 and the insulating layers IL may have a high etch selectivity in a wet etching process using chemical solution and have a low etch selectivity in a dry etching process using etching gas.

The sacrificial layers 107 may be formed to have substantially the same thickness as each other. Alternatively, the inventive concept is not limited thereto, and the sacrificial layers 107 may include at least one sacrificial layer different in thickness from other sacrificial layers. For example, the uppermost and lowermost sacrificial layers 170 among the sacrificial layers 170 may be formed to be thinner than the sacrificial layers 170 therebetween. The insulating layers IL may have substantially the same thickness as each other or may include at least one insulating layer different in thickness from other insulating layers.

An end portion of the thin film structure TS adjacent to the peripheral region PR may have a stepped structure. For example, as the insulating layers IL and the sacrificial layers 107 become increasingly closer to the top surface of the semiconductor substrate 100, the end portion of the insulating layers IL and the sacrificial layers 107 are extended further toward the peripheral region PR. As the sacrificial layers 107 become increasingly distant from the top surface of the semiconductor substrate 100, the distance between sidewalls of the sacrificial layers 107 and the peripheral region PR is increased. For example, the forming of the thin film structure TS may include alternately forming insulating layers IL and sacrificial layers 107 on the semiconductor substrate 100. The insulating layers IL and the sacrificial layers 107 may be patterned by repeatedly etching the insulting layers IL and the sacrificial layers 107 using a mask pattern. The horizontal area of the mask pattern (not shown) may be reduced such that the end portions of the insulating layers IL are sequentially exposed in the etching process and the stepped structure is formed at the end portion of the thin film structure TS. The insulating layers IL and the sacrificial layers 107 may be anisotropically etched. After the forming of the peripheral logic structure PLS and the thin film structure TS, a buried insulating layer 114 is formed on the semiconductor substrate 100. The buried insulating layer 114 covers the thin film structure TS having the stepped structures formed in the cell region CR and the peripheral logic structure PLS formed the peripheral region PR through a deposition technique. A planarization process may be performed on the buried insulating layer 114. Accordingly, the buried insulating layer 114 may have a planarized top surface. For example, the buried insulating layer 114 may be formed of oxide including a High Density Plasma (HDP) oxide layer, TetraEthylOrthosilicate (TEOS), Plasma Enhanced TetraEthylOrthoSilicate (PE-TEOS), 03-Tetra EthylOrthoSilicate (TEOS), Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or a mixture thereof. Alternatively, the buried insulating layer 114 may include a silicon nitride, a silicon oxynitride, or a low-k material.

Figure 7:
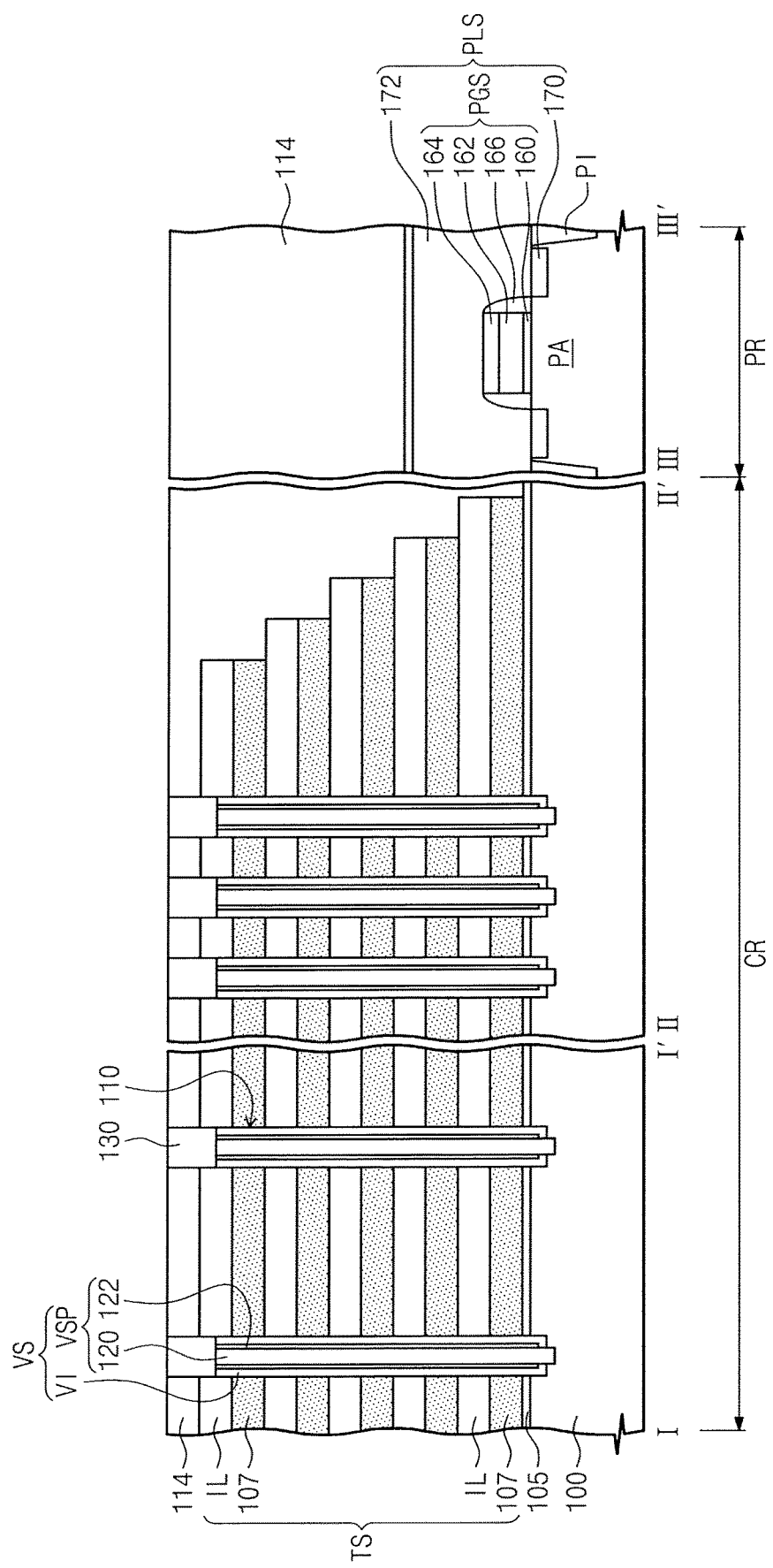

Referring to FIG. 7, a vertical structure VS penetrating the thin film structure TS is formed on the semiconductor substrate 100 in the cell region CR. The forming of the vertical structure VS may include forming a through hole 110 penetrating the thin film structure TS to expose the semiconductor substrate 100 and forming a vertical insulator VI and a vertical semiconductor pattern VSP in the through hole 110.

The forming of the through hole 110 may include forming a mask pattern (not shown) on the thin film structure TS and anisotropically etching the thin film structure TS by using the mask pattern (not shown) as an etching mask. During the anisotropic etching process, the top of the semiconductor substrate 100 may be over-etched, and accordingly, the top surface of the semiconductor substrate 100 exposed by the through hole 110 may be recessed in a predetermined depth. The inner sidewall of the through hole 110 may be sloped such that the through hole 110 becomes narrower downwardly. The through holes 110, when viewed from the above, are arranged in a straight line or in a zigzag manner along the first direction D1.

The forming of the vertical insulator VI and the vertical semiconductor pattern VSP may include forming the vertical insulator VI and a first semiconductor pattern 122 filling a portion of the through hole 110 and exposing the top surface of the semiconductor substrate 100 and forming a second semiconductor pattern 120 filling the remaining of the through hole 110.

The forming of the vertical insulator VI and the first semiconductor pattern 122 may include sequentially forming a vertical insulating layer and a first semiconductor layer covering the inner wall of the through hole 110 and anisotropically etching the vertical insulating layer and the first semiconductor layer.

The vertical insulating layer and the first semiconductor layer may be formed to fill a portion of the through hole 110. The total thicknesses of the vertical insulating layer and the first semiconductor layer may be less than half the width of the through hole 110. For example, the through hole 110 need not be completely filled with the vertical insulating layer and the first semiconductor layer. Furthermore, the vertical insulating layer may cover the top surface of the semiconductor substrate 100 exposed by the through hole 110. The vertical insulating layer may be formed of thin films that may be deposited through a plasma enhanced CVD, physical CVD, or Atomic Layer Deposition (ALD) technique, for example.

The vertical insulating layer may include a charge storage layer used as a memory element of a flash memory device. For example, the charge storage layer may be a trap insulating layer or an insulating layer including conductive nano dots. Alternatively, the vertical insulating layer may include a thin film for phase change memory or a thin film for variable resistance memory.

The vertical insulating layer may include a blocking insulating layer, a charge storage layer, and a tunnel insulating layer, which are sequentially stacked. The blocking insulating layer may cover the sidewalls of the sacrificial layers 107 and the insulating layers IL exposed by the through hole 110 and the top surface of the semiconductor substrate 100. The blocking insulating layer may be formed of a silicon oxide layer. For example, the charge storage layer may include a trap insulating layer or an insulating layer including conductive nano dots. For example, the charge storage layer may include at least one of a silicon nitride layer, a silicon oxynitride layer, a Si-rich nitride layer, a nanocrystalline Si layer, and a laminated trap layer. The tunnel insulating layer may be formed of one of materials having a greater energy band gap than that of the charge storage layer. For example, the tunnel insulating layer may be a silicon oxide layer.

The first semiconductor layer may be formed on the vertical insulating layer. The first semiconductor layer may be a semiconductor material layer (for example, a polycrystalline silicon layer, a single crystal silicon layer, or an amorphous silicon layer), which may be formed using one of ALD or CVD technique.

After the vertical insulating layer and the first semiconductor layer are formed sequentially, the semiconductor substrate 100 may be exposed by anisotropically etching the first semiconductor layer and the vertical insulating layer. Accordingly, the first semiconductor pattern 122 and the vertical insulator VI may be formed in the inner wall of the through hole 110. The vertical insulator VI and the first semiconductor pattern 122 may be formed in a cylindrical form having both ends opened. While the first semiconductor layer and the vertical insulating layer are anisotropically etched, as a result of over-etch, the top surface of the semiconductor substrate 100 exposed by the first semiconductor pattern 122 and the vertical insulating layer VI may be recessed.

Moreover, during the anisotropic etching process, a portion of the vertical insulating layer below the first semiconductor pattern 122 need not be etched, because the vertical insulator VI may have a bottom disposed between the bottom surface of the first semiconductor pattern 122 and the top surface of the semiconductor substrate 100.

Furthermore, while the first semiconductor layer and the vertical insulating layer are anisotropically etched, the top surface of the buried insulating layer 114 may be exposed. Accordingly, the vertical insulator VI and the first semiconductor pattern 122 may be locally formed in the through hole 110.

The forming of the second semiconductor pattern 120 may include forming a second semiconductor layer filling the remaining of the through hole 110 and planarizing the second semiconductor layer.

For example, a second semiconductor layer may be formed in the through hole 110 having the vertical insulator VI and the first semiconductor pattern 122. The second semiconductor layer may connect the semiconductor substrate 100 and the first semiconductor pattern 122. The second semiconductor layer, for example, may include a polycrystalline silicon layer, a single crystal silicon layer, or an amorphous silicon layer. Then, by exposing the top surface of the buried insulating layer 114 after planarizing the second semiconductor layer, the second semiconductor pattern 120 is locally formed in the through hole 110.

The second semiconductor pattern 120 may be formed in a pillar form filling the through hole 110. Alternatively, the second semiconductor pattern 120 may have a pipe form with one end closed, a hollow cylindrical form with one end closed, or a cup form.

The first semiconductor pattern 122 and the second semiconductor pattern 120 are defined as the vertical semiconductor pattern VSP and the vertical insulator VI and the vertical semiconductor pattern VSP are defined as the vertical structure VS.

Then, a conductive pad 130 connected to the vertical semiconductor pattern VSP is formed. The conductive pad 130 may be formed by recessing the top end of the vertical structure VS and then filling the recessed area with a conductive material. Alternatively, the conductive pad 130 may be formed to be doped with a different conductive type impurity than the first and second semiconductor patterns 122 and 120. A diode may be formed by the interface between the conductive pad 130 and the vertical structure VS.

Figure 8:
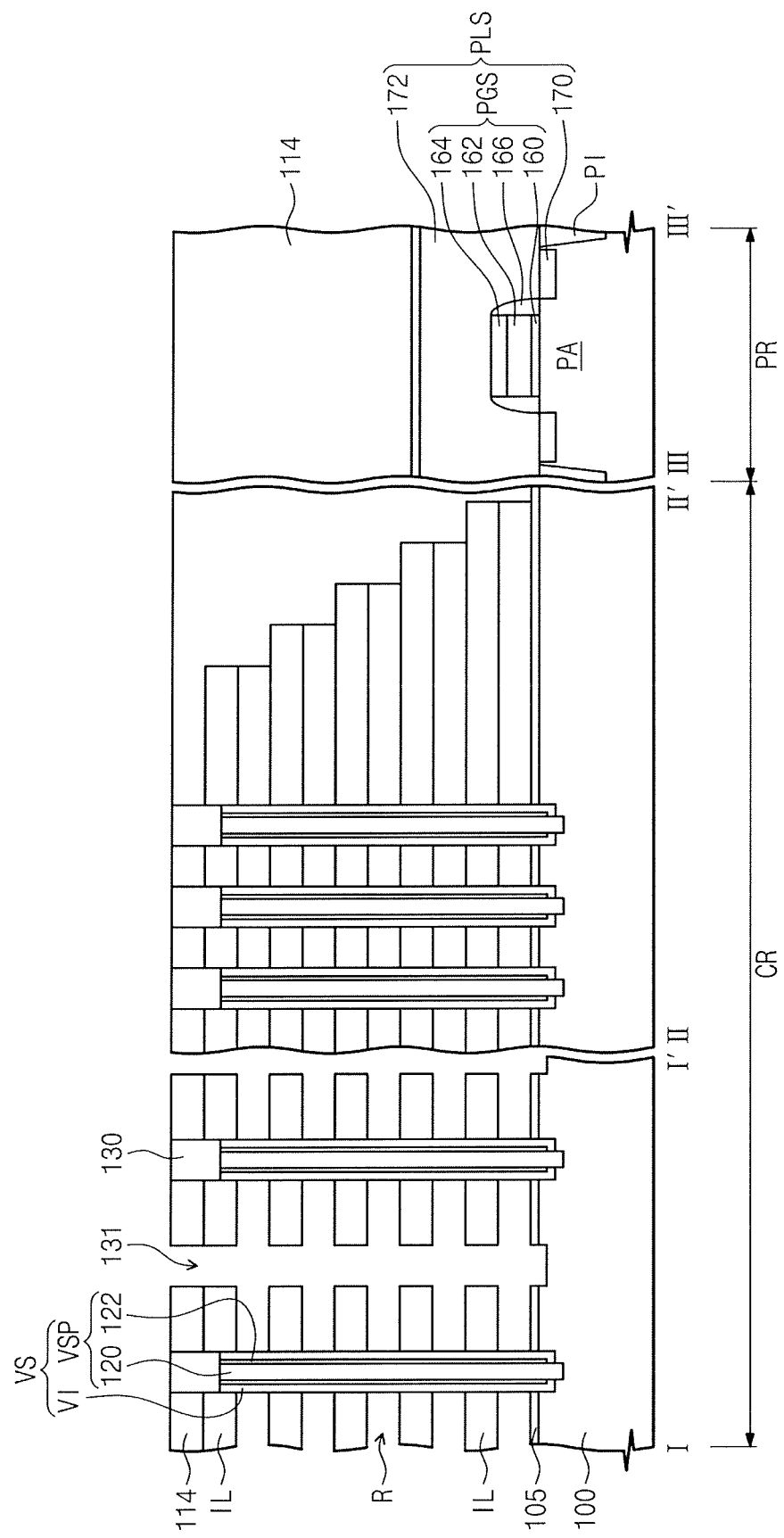

Referring to FIG. 8, a trench 131 exposing the semiconductor substrate 100 is formed by patterning the thin film structure TS.

The trench 131 may expose the sidewalls of the sacrificial layers 107 and the insulating layers 1L, being spaced apart from the vertical structure VS. The trench 131, when viewed from the above, may be formed in a line form or a rectangular form. The trench 131 exposes the top surface of the semiconductor substrate 100. The trench 131 may be formed by performing an anisotropic etching process and the top of the semiconductor substrate 100 may be over-etched by the etching process.

The thin film structure TS, when viewed from the above, may be divided into line forms by the trench 131. For example, the trench 131 penetrates the thin film structure TS, and the line forms are separated by the trench 131. Each of the line forms may include the sacrificial layers 107 and the insulating layers IL patterned by the trench. The sacrificial layers 107, the insulating layers IL and the substrate 100 may be exposed by the trench 131.

Then, by removing the sacrificial layers 107 exposed by the trench 131, recess regions R are formed between the insulating layers IL patterned by the trench 131.

For example, the recess regions R may be formed by isotropically etching the sacrificial layers 107. The etching conditions may have etch selectivity of the sacrificial layers 107 with respect to the insulating layers IL and the vertical insulator VI. The sacrificial layers 107 are completely removed by the isotropic etching process. For example, when the sacrificial layers 107 are a silicon nitride layer and the insulating layers IL is a silicon oxide layer, the etching process may be performed by using an etchant including phosphate.

Figure 9:
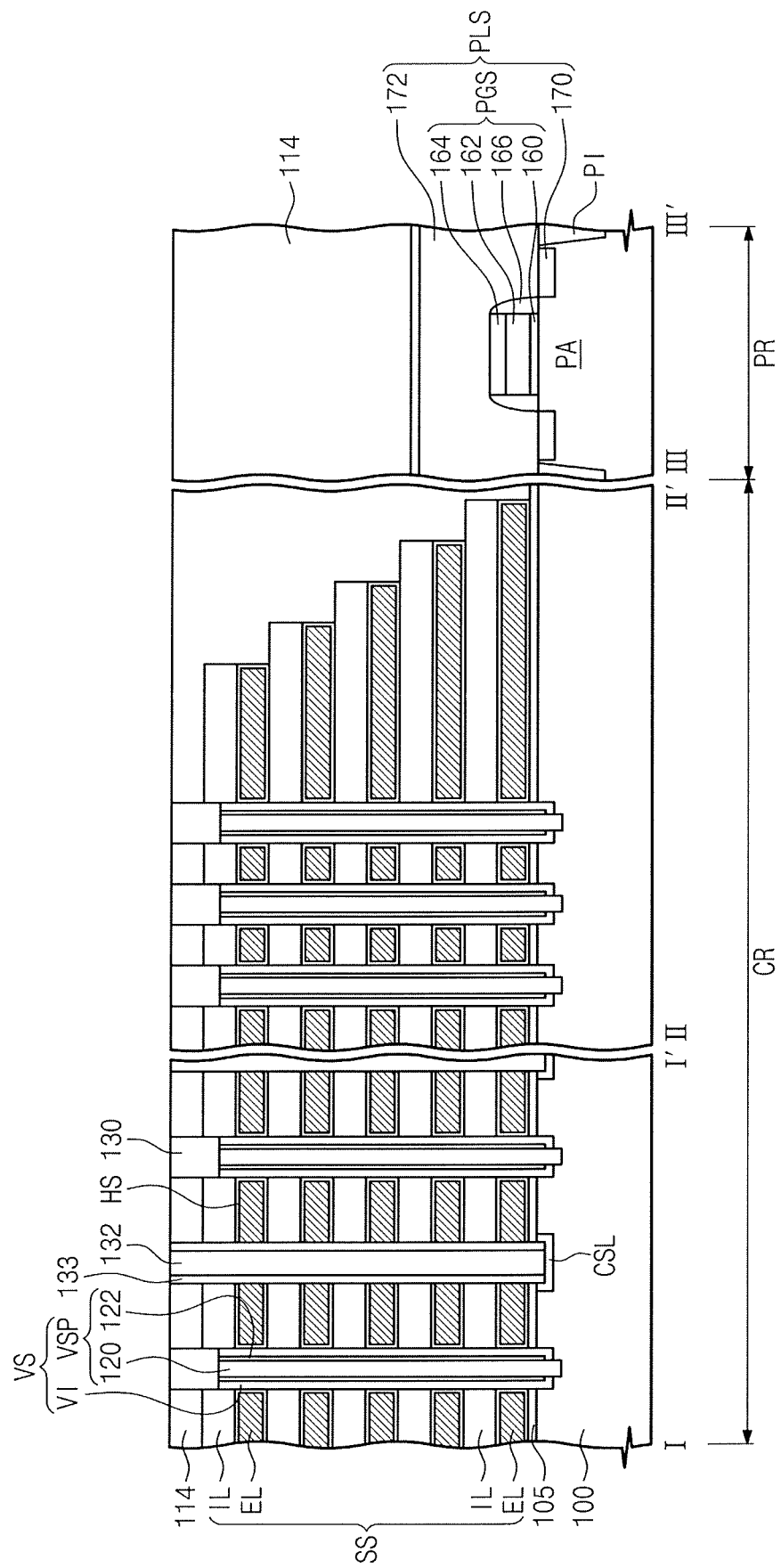

Referring to FIG. 9, horizontal structures HS and gate electrodes EL are formed in the recess regions R. The horizontal structures HS are conformally formed on the inner walls of the recess regions R. The gate electrodes EL are disposed on the horizontal structures HS, filling the remaining spaces of the recess regions R.

The forming of the horizontal structures HS and the gate electrodes EL may include forming a horizontal insulating layer and a conductive layer that sequentially cover the recess regions R and locally forming the horizontal structures HS and the gate electrodes EL in the recess regions R by removing the horizontal insulating layer and the conductive layer in the trench 131.

The horizontal insulating layer may be formed at least one thin film layer, like the vertical insulating layer. For example, the horizontal insulating layer may include a blocking insulating layer of a charge trap type flash memory. For example, the blocking insulating layer may be formed of high-k dielectric layers such as an aluminum oxide layer and a hafnium oxide layer.

The forming of the conductive layer may include sequentially depositing a barrier metallic layer and a metallic layer. The barrier metallic layer may include a metallic nitride layer formed of TiN, TaN, or WN and the metallic layer may include a metallic material such as W, Al, Ti, Ta, Co, or Cu.

A stacked structure SS includes the gate electrodes EL and the insulating layers IL stacked on each other. The stacked structure SS, the vertical structure VS, and the horizontal structures HS may constitute cell array structures CAS1 and CAS2, as shown in FIG. 3.

A common source region CSL is formed on the substrate 100. For example, after the forming of the gate electrodes EL, the common source region CSL may be formed on the semiconductor substrate 100. Alternatively, the common source region CSL may be formed by performing an ion implantation process on the semiconductor substrate 100 exposed by the trench 131. Furthermore, an electrode pattern 132 is formed in the trench 131. The electrode pattern 132 may include metal and metal silicide. An insulating spacer 133 is formed between the electrode pattern 132 and the gate electrodes EL. The insulating spacer 133 electrically separates the gate electrodes EL from the electrode pattern 132. The insulating spacer 133 may include at least one of a silicon oxide layer, a silicon nitride layer, and a silicon oxynitride layer.

Referring back to FIGS. 3 and 4, a bit line contact plug 140 is formed to the conductive pad 130 and a bit line BL. The bit line contact plug 140 is formed on the cell array structures CAS1 and CAS2. The bit line BL is electrically connected to the first and second semiconductor patterns 122 and 120 through the bit line contact plug 140. The bit line BL is spaced apart from the cell array structures CAS1 and CAS2 by an interlayer insulating layer 115.

Furthermore, a wiring structure for electrically connecting the cell array structure CAS and the peripheral logic structure PLS is formed on the interlayer insulating layer 115 of the cell regions CR1 and CR2. The wiring structure may include cell plugs 150. The cell plugs 150 penetrating the buried insulating layer 114 are connected to the end portions of the gate electrodes EL. As the cell plugs 150 become closer to the peripheral region PR, the vertical length of the cell plugs 150 increases. The wiring structure further include cell connection lines 154 that are electrically connected to the cell plugs 150 through the cell contacts 152. The cell connection lines 154 are formed on the interlayer insulating layer 115.

The wiring structure further includes a peripheral wire 182 that is formed on the interlayer insulating layer 115 in the peripheral region PR. Although not shown in the drawing, the peripheral wires 182 may be electrically connected to the peripheral gate structure PGS and the source and drain regions 170 through the peripheral contact plugs 180 and the peripheral contact pads 181 penetrating the buried insulating layer 114.

Figure 10:
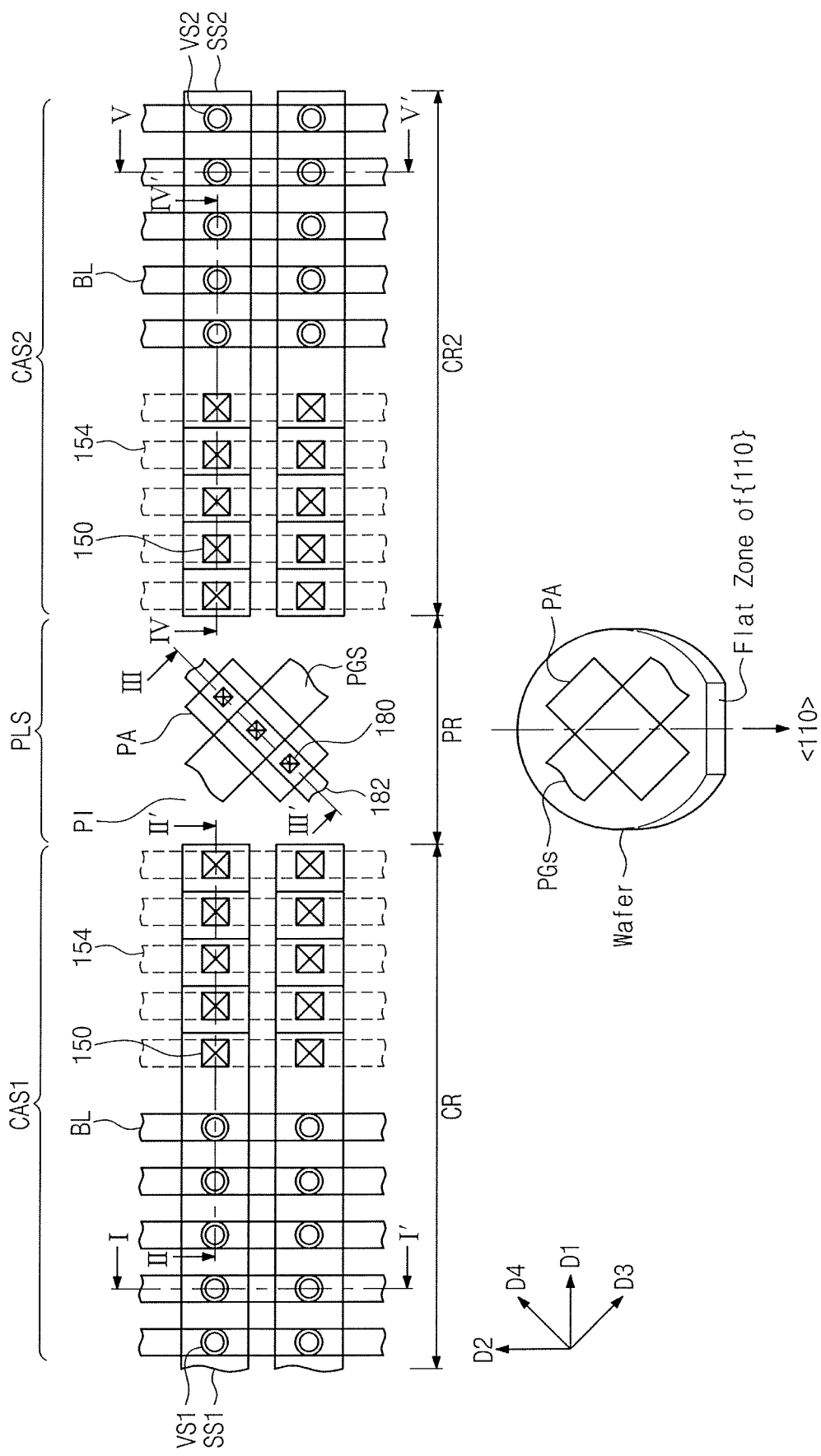
FIG. 10 is a plan view of a semiconductor device according to an exemplary embodiment of the present inventive concept.

FIG. 10 is a plan view of a semiconductor device according to an exemplary embodiment of the inventive concept. The same reference numerals may refer to the same configuration of the semiconductor device of FIGS. 3 to 5 and thus, the descriptions thereof may be omitted. Sectional views of FIG. 10 taken along lines I-I', II-II', III-III', IV-IV', and V-V' are substantially identical to those of FIG. 4.

Referring to FIGS. 4 and 10, the semiconductor substrate 100 includes a first cell region CR1, a second cell region CR2, and a peripheral region PR therebetween. The semiconductor substrate 100 may be a silicon substrate.

A first cell array structure CAS1 is disposed in the first cell region CR1 of the semiconductor substrate 100. A second cell array structure CAS2 is disposed in the second cell region CR2 of the semiconductor substrate 100. A peripheral logic structure PLS is disposed in the peripheral region PR of the semiconductor substrate 100. The first cell array structure CAS1 may be substantially symmetric to the second cell array structure CAS2 with respect to the peripheral region PR.

The first cell array structure CAS1 includes a first stacked structure SS1 where insulating layers IL and first gate electrodes EL1 are alternately and repeatedly stacked on the semiconductor substrate 100. A first vertical structure VS1 penetrates the first stacked structure SS1. The first stacked structure SS1 is linear-shaped, extending in a first direction D1. The second cell array structure CAS2 includes a second stacked structure SS2 where insulating layers IL and second gate electrodes EL2 are alternately and repeatedly stacked on the semiconductor substrate 100. A second vertical structure VS2 penetrates the second stacked structure SS2. The second stacked structure SS2 is line-shaped, extending in the first direction D1.

A device isolation layer PI defining a peripheral active pattern PA may be disposed on the semiconductor substrate 100 in the peripheral region PR, as shown in FIG. 4. The peripheral logic structure PLS includes a peripheral gate structure PGS crossing the peripheral active pattern PA, source and drain regions 170 formed in the peripheral active pattern PA at both sides of the peripheral gate structure PGS, and a peripheral insulating pattern 172 covering the peripheral gate structure PGS and the source and drain regions 170. The peripheral gate structure PGS extends in a third direction D3 that intersects the first direction D1 and a second direction D2 intersecting the first direction D1.

Referring back to FIGS. 5 and 10, the peripheral active pattern PA extends along a reference axis a of a fourth direction D4 that intersects the first direction D1, the second direction D2, and the third direction D3. The semiconductor substrate 100 may have a silicon crystal structure. The reference axis a of the peripheral active pattern PA crosses at an oblique angle θ with an intersection line L where a {111} plane P of the silicon crystal structure meets a top surface 100U of the semiconductor substrate 100. The angle θ between the reference axis a of the peripheral active pattern PA and the intersection line L may be greater than 0° and be less than or equal to about 45°. The angle θ may include an angle error of ±1° which may occur when a wafer is manufactured. The source and drain regions 170 formed in the peripheral active pattern PA, when viewed from the above, are spaced apart from each other along the fourth direction D4.

Figure 11:
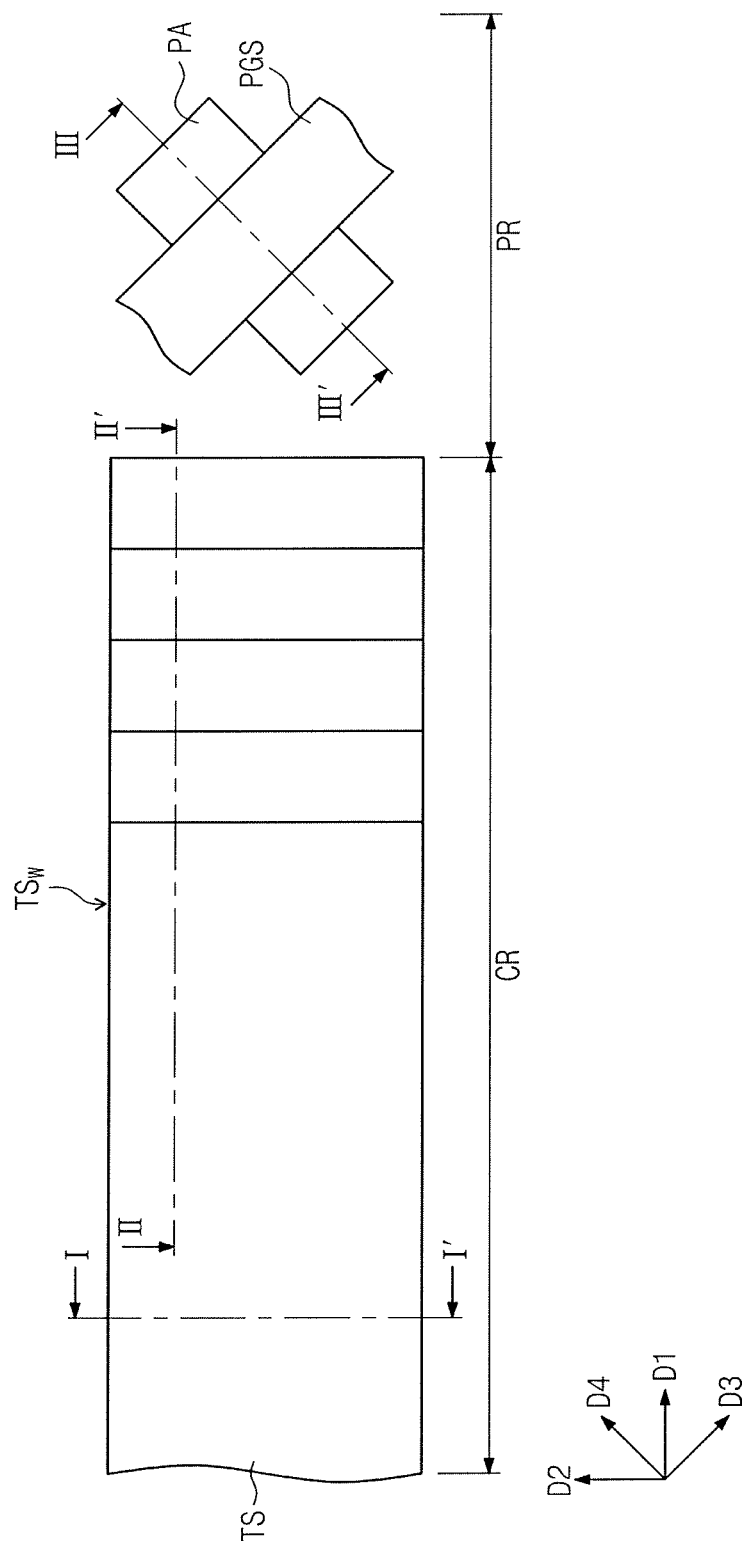
FIG. 11 is a plan view illustrating a method of manufacturing a semiconductor device according to an exemplary embodiment of the present inventive concept.

FIG. 11 is a plan view illustrating a method of manufacturing a semiconductor device according to an exemplary embodiment of the inventive concept. Sectional views of FIG. 11 taken along lines I-I', II-II', and III-III' are substantially identical to those of FIG. 6. The same reference numerals may refer to the same configuration of the semiconductor device of FIGS. 6 to 9 and thus, the descriptions thereof may be omitted.

Referring to FIGS. 6 and 11, a semiconductor substrate 100 having a silicon crystalline structure may be provided. For example, the semiconductor substrate 100 may be a silicon wafer. The semiconductor substrate 100 may have a flat zone formed on a {110} plane of the silicon crystal structure, as shown in FIG. 10.

The semiconductor substrate 100 includes a cell region CR and a peripheral region PR. A device isolation layer PI defining a peripheral active pattern PA is formed on the semiconductor substrate 100 in the peripheral region PR. The peripheral active pattern PA, as described with reference to FIGS. 5 and 10, extends along a reference axis a of a fourth direction D4. The reference axis a may be parallel to a <100> direction of the silicon crystal structure. An intersection line L is a line where a {111} plane P of the silicon crystal structure meets with a top surface 100U of the semiconductor substrate 100. The oblique angle θ between the reference axis a of the peripheral active pattern PA and the intersection line L may be greater than about 0° and be less than or equal to about 45°. The oblique angle θ may include an angle error of ±1° which may occur when a wafer is formed.

A peripheral gate structure PGS crossing the peripheral active pattern PA and extending in a third direction D3 substantially perpendicular to the fourth direction D4 is formed on the semiconductor substrate 100 in the peripheral area PR. Source and drain regions 170 are formed in the peripheral active pattern PA at both sides of the peripheral gate structure PGS. For example, a pair of source and drain regions 170 is formed along the reference axis a at both sides of the peripheral gate structure PGS, and the source and drain regions 170 are spaced apart from each other in the fourth direction D4. The reference axis a is in parallel to the fourth direction D4. For example, the source and drain regions 170 need not be arranged in a direction where the intersection line L is extended.

A thin film structure TS where sacrificial layers 107 and insulating layers IL are alternately and repeatedly deposited may be formed on the semiconductor substrate 100 in the cell region CR. An end portion of the thin film structure TS may have a cascade structure. The thin film structure may be formed to have outer walls TSw extending along the first direction D1 that intersects the third direction D3 and the fourth direction D4 from a planar point of view.

After the forming of the peripheral logic structure PLS and the thin film structure TS, a buried insulating layer 114 may be formed on the semiconductor substrate 100. Processes after this are identical to those in the method of manufacturing a semiconductor device described with reference to FIGS. 7 to 9.

Figure 12:
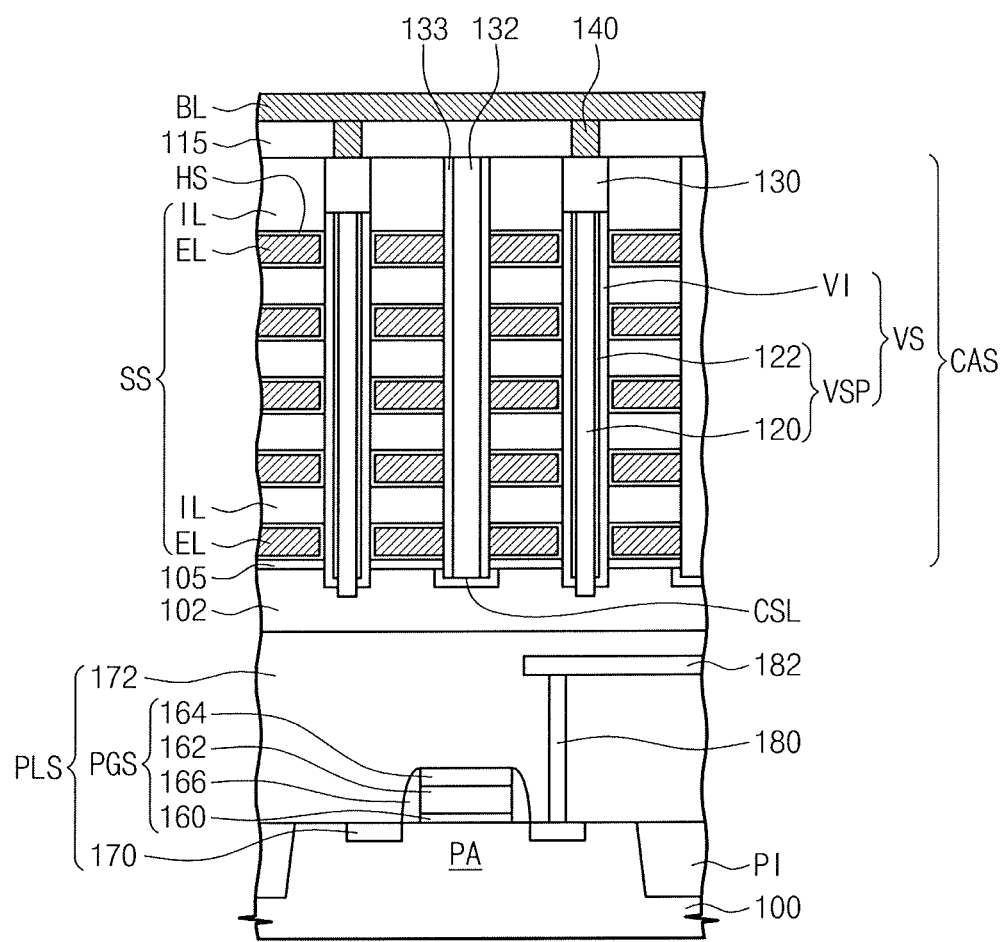
FIG. 12 is a sectional view of a semiconductor device according to an exemplary embodiment of the present inventive concept.

FIG. 12 is a sectional view of a semiconductor device according to an exemplary embodiment of the inventive concept. The same reference numerals may refer to the same elements of the semiconductor device of FIGS. 3 to 5 and thus, the descriptions thereof may be omitted.

Referring to FIG. 12, the semiconductor device includes a peripheral logic structure PLS on a semiconductor substrate 100, a cell array structure CAS disposed on the peripheral logic structure PLS, and an intermediate substrate 102 interposed between the peripheral logic structure PLS and the cell array structure CAS. For example, the semiconductor substrate 100 may be a silicon substrate. A device isolation layer PI defining a peripheral active pattern PA is formed on the semiconductor substrate 100.

Referring to FIGS. 5 and 12, the peripheral logic structure PLS includes a peripheral gate structure PGS crossing the peripheral active pattern PA, source and drain regions 170 formed in the peripheral active pattern PA at both sides of the peripheral gate structure PGS, and a peripheral insulating pattern 172 covering the peripheral gate structure PGS and the source and drain regions 170.

For example, the source and drain regions 170 of the peripheral active pattern PA, when viewed from the above, are arranged in a reference axis a and are disposed at both sides of the peripheral gate structure PGS. The semiconductor substrate 100 may have a silicon crystal structure. The reference axis a of the peripheral active pattern PA may form an oblique angle θ with an intersection line L where a {111} plane P and a top surface 100U of the silicon semiconductor substrate 100 meet. The oblique angle θ may be greater than about 0° and be less than or equal to about 45°. The oblique angle θ may include an angle error of ±1° which may occur when a wafer is manufactured. The source and drain regions 170 formed in a peripheral active pattern PA are spaced apart from each other along the reference axis a and accordingly, the source and drain regions 170 are not arranged along the intersection line L.

A peripheral wire 182 is disposed on the semiconductor substrate 100. The peripheral wire 182 is connected to the source and drain regions 170 through the peripheral contact plug 180 penetrating the peripheral insulating pattern 172. The peripheral gate structure PGS may form a current path between the source and drain regions 170. The gate structure PGS, and the source and drain regions 170 may constitute a transistor. Leakage current of the transistor may be reduced when the current path between the source and drain regions 170 is not on {111} plane where a highest leakage current path may be formed.

The cell array structure CAS is disposed on the intermediate substrate 102. The cell array structure CAS includes a stacked structure SS wherein insulating layers IL and gate electrodes EL are alternately and repeatedly stacked on the intermediate substrate 102.

The cell array structure CAS includes a vertical structure VS penetrating the stacked structure SS to be connected to the intermediate substrate 102. The vertical structure VS includes a vertical semiconductor pattern VSP penetrating the stacked structure SS to be electrically connected to the intermediate substrate 102 and a vertical insulating layer VI between the vertical semiconductor pattern VSP and the stacked structure SS. The vertical semiconductor pattern VSP includes a first semiconductor pattern 122 and a second semiconductor pattern 120.

The cell array structure CAS includes horizontal structures HS disposed between the gate electrodes EL and the insulating layers IL. The horizontal structures HS are disposed between the gate electrodes EL and the vertical insulator VI and between the gate electrodes EL and the insulating layers IL.

A lower insulating layer 105 is disposed between the intermediate substrate 102 and the stacked structure SS. A conductive pad 130 penetrates the stacked structure SS to be connected to the vertical semiconductor pattern VSP. Common source regions CSL are disposed on the intermediate substrate 102 at both sides of the stacked structure SS. Electrode patterns 132 are disposed at both sides of the stacked structure SS to cover the common source regions CSL. An insulating spacer 133 is disposed between the electrode patterns 132 and the gate electrodes EL.

A bit line crossing the stacked structure SS is disposed on the stacked structure SS. The bit line BL is electrically connected to the conductive pad 130 through a bit line contact plug 140 and is spaced apart from the stacked structure SS by an interlayer insulating layer 115.

Figure 13:
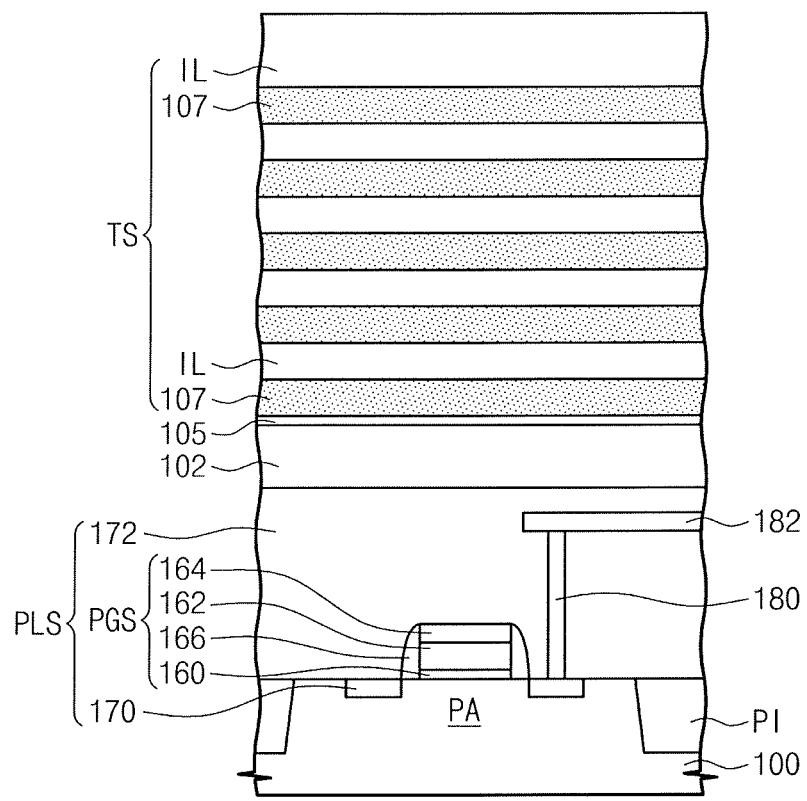
FIG. 13 is a sectional view illustrating a method of manufacturing a semiconductor device according to an exemplary embodiment of the present inventive concept.

FIG. 13 is a sectional view illustrating a method of manufacturing a semiconductor device according to an exemplary embodiment of the inventive concept. The same reference numerals may refer to the same elements of the semiconductor device of FIGS. 6 to 9 and thus, descriptions thereof may be omitted.

Referring to FIG. 13, a semiconductor substrate 100 having a silicon crystal structure is provided. For example, the semiconductor substrate 100 may be a silicon wafer. A device isolation layer PI defining a peripheral active pattern PA is formed on the semiconductor substrate 100.

As described with reference to FIG. 5, the peripheral active pattern PA, when viewed from the above, may have a reference axis a along which the source and the drain regions are aligned. For example, the reference axis a may cross an intersection line L at an oblique angle θ therebetween. The intersection line L is a line where a {111} plane P of the silicon crystal structure and a top surface 100U of the semiconductor substrate 100 meet. The angle θ between the reference axis a of the peripheral active pattern PA and the intersection line L may be an angle between about 0° and about 45°, or may be about 45°. The angle θ may include an angle error of ±1° which may occur when a wafer is manufactured.

A peripheral gate structure PGS crossing the peripheral active pattern PA is formed on the semiconductor substrate 100. Source and drain regions 170 are formed in the peripheral active pattern PA at both sides of the peripheral gate structure PGS. The source and drain regions 170 formed in a peripheral active pattern PA, as described with reference to FIG. 5, are spaced apart from each other along the reference axis a. For example, the source and drain regions 170 are not arranged along the intersection line L.

A peripheral wire 182 electrically connected to the peripheral gate structure and the source and drain regions 170 through a peripheral contact plug 180 is formed on the semiconductor substrate 100. Then, a peripheral insulating pattern 182 covering the peripheral gate structure PGS, the source and drain regions 170, the peripheral contact plug 180, and the peripheral wire 182 is formed on the semiconductor substrate 100. By performing a planarization process on the peripheral insulating pattern 182, the peripheral insulating pattern 172 has a planarized top surface. The peripheral gate structure PGS, the source and drain regions 170, and the peripheral insulating pattern 172 are defined as a peripheral logic structure.

An intermediate substrate 102 is formed on the peripheral insulating pattern 172. The intermediate substrate 102 may be formed of a semiconductor layer having a single crystal or polycrystalline structure. For example, the intermediate substrate 102 may be formed of a poly silicon layer. The intermediate substrate 102 may be formed by performing a deposition process such as CVD, for example.

A lower insulating layer 105 is formed on the intermediate substrate 102 and a thin film structure TS is formed by alternately and repeatedly depositing sacrificial layers 107 and insulating layers IL on the lower insulating layer 105.

Processes after this are identical to those in the method of manufacturing a semiconductor device described with reference to FIGS. 7 to 9.

According to an exemplary embodiment of the inventive concept, the peripheral active pattern PA having the reference axis a in one direction from a planar point of view may be formed on the semiconductor substrate including a silicon crystal structure. The source and drain regions 170 formed in a peripheral active pattern PA may be spaced apart from each other along the reference axis a of the peripheral active pattern PA from a planar point of view. The reference axis a of the peripheral active pattern PA may form an oblique angle with the intersection line L where the {111} plane P of a silicon crystal structure and the top surface of the semiconductor substrate meet. The source and drain regions 170 need not be arranged in a direction where the intersection line L is extended. Accordingly, even when a dangling bond is formed between silicon atoms in the {111} plane, a current path connecting the source and drain regions 170 does not occur, so that a leakage current may be decreased between the source and drain regions 170. Therefore, a semiconductor device having reduced leakage current may be provided.

Figure 14:
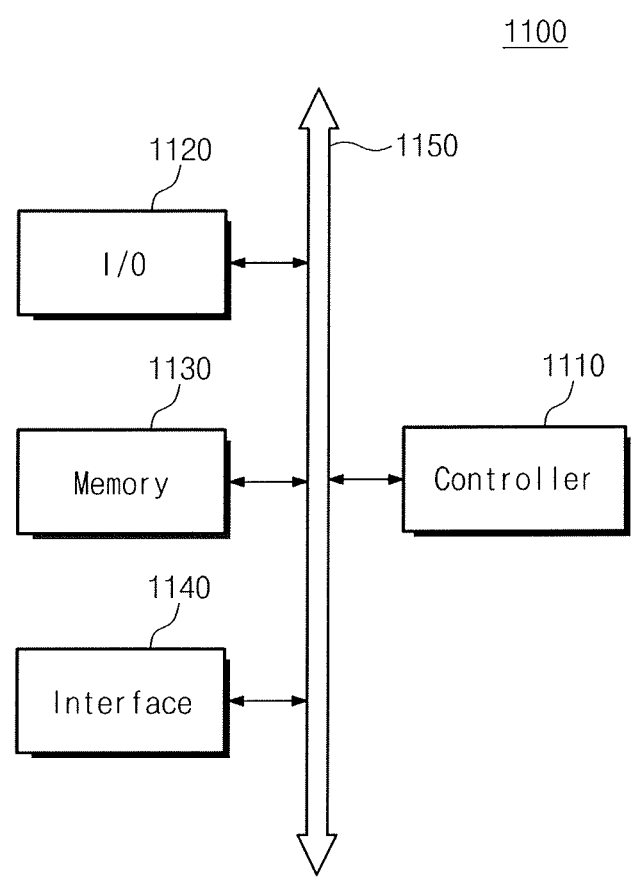
FIG. 14 is a block diagram of a memory system including a three-dimensional semiconductor memory device according to an exemplary embodiment of the present inventive concept.

FIG. 14 is a schematic block diagram of a memory system including a three-dimensional semiconductor memory device according to an exemplary embodiment of the inventive concept.

Referring to FIG. 14, the memory system 1100 may be applied to a PDA, a portable computer, a web tablet, a wireless phone, a mobile phone, a digital music player, a memory card, or all devices transmitting/receiving information in a wireless environment.

The memory system 1100 includes a controller 1110, an input/output device 1120 such as a keypad, a keyboard, and a display, a memory 1130, an interface 1140, and a bus 1150. The memory 1130 and the interface 1140 communicate with each other through the bus 1150.

The controller 1110 includes at least one micro processor, a digital signal processor, a micro controller, and other process devices similar thereto. The memory 1130 may be used for storing instructions executed by the controller 1110. The input/output device 1120 may receive/output data or signals from/to the outside of the memory system 1100. For example, the input/output device 1120 may include a keyboard, a keypad, or a display device.

The memory 1130 includes a three-dimensional semiconductor memory device according to an exemplary embodiment of the inventive concept. The memory 1130 may further include various memories such as a random access volatile memory.

The interface 1140 may transmit data to a communication network or receive data from a network.

A three-dimensional semiconductor memory device or a memory system according to an exemplary embodiment of the inventive concept may be mounted through various types of packages. For example, a three-dimensional semiconductor memory device or a memory system according to an embodiment of the inventive concept may be packaged and mounted through package methods, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 15:
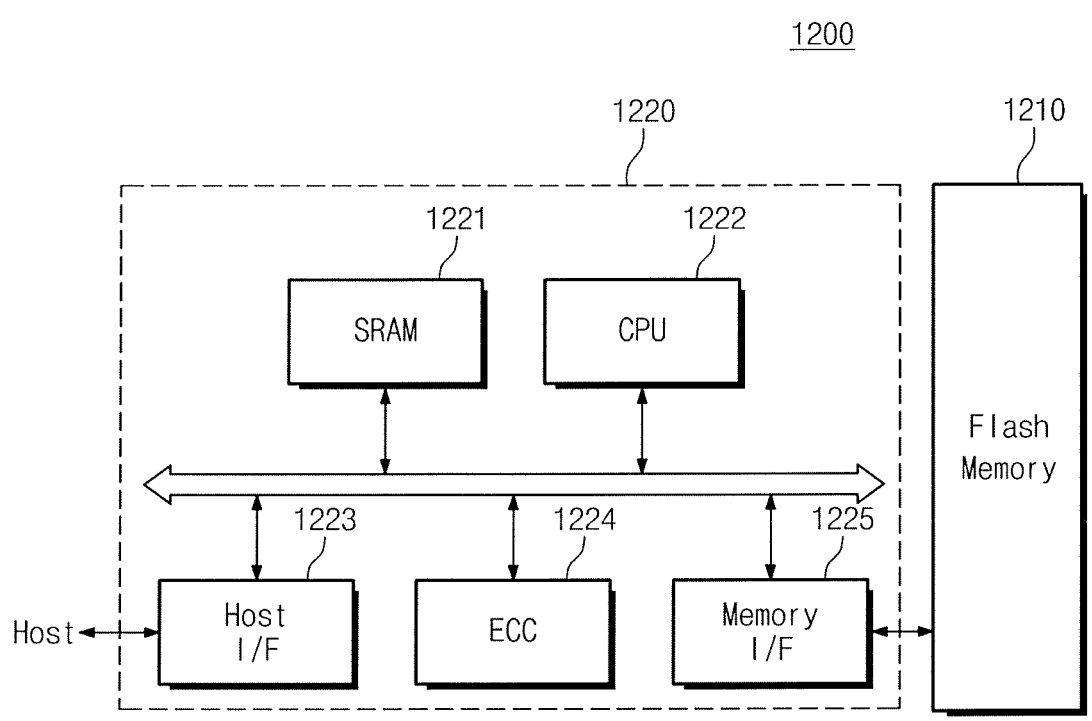
FIG. 15 is a block diagram illustrating a memory card including a three-dimensional semiconductor memory according to an exemplary embodiment of the present inventive concept.

FIG. 15 is a schematic block diagram illustrating a memory card including a three-dimensional semiconductor memory according to an exemplary embodiment of the inventive concept.

Referring to FIG. 15, the memory card 1200 which may store a large amount of data includes a flash memory device 1210. The flash memory device 1210 includes a three-dimensional semiconductor memory device according to an exemplary embodiment of the inventive concept. The memory card 1200 includes a memory controller 1220 for controlling general data exchange between a host and the flash memory device 1210.

A static random access memory (SRAM) 1221 may serve as an operating memory of a processing unit 1222. A host interface 1223 may allow a host to access the memory card 1200 using a data exchange protocol. An error correction block 1224 may detect and correct an error in data read from the flash memory device 1210. The memory interface 1225 may allow the memory card 1200 to access the flash memory device 1210. The processing unit 1222 may perform a general control operation for data exchange of the memory controller 1220. The memory card 1200 may further include read only memory (ROM) (not shown) storing code data for interfacing with a host.

Figure 16:
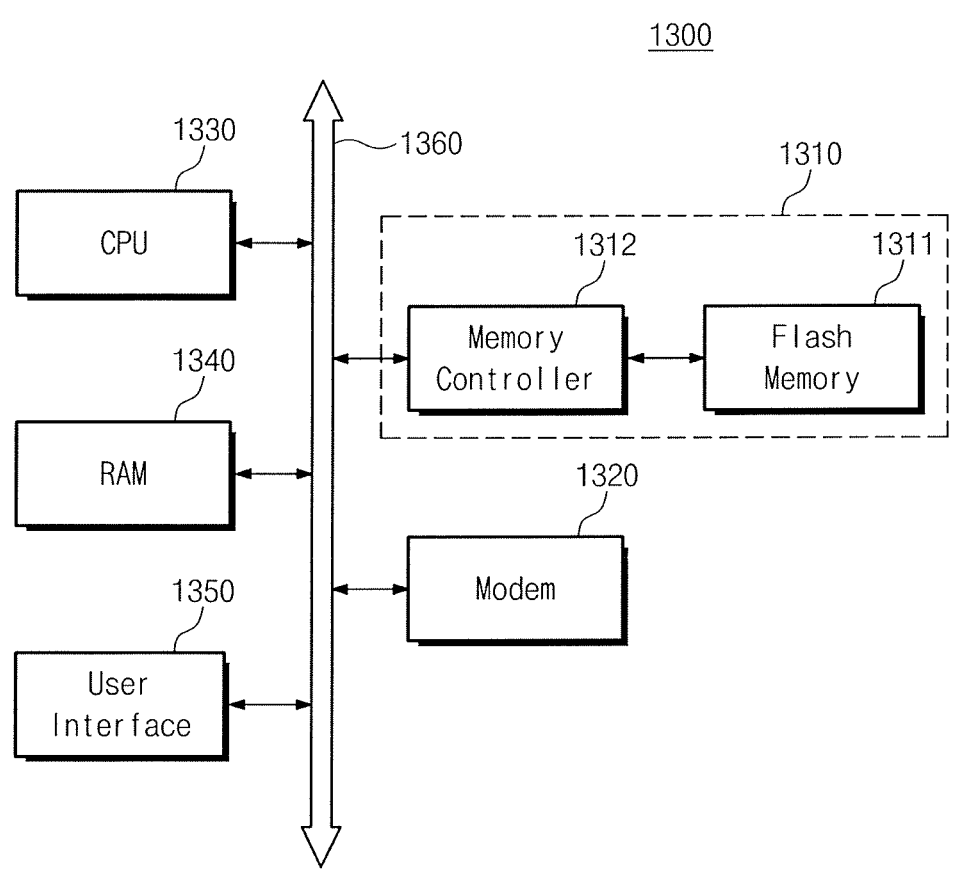
FIG. 16 is a block diagram illustrating an information processing system including a three-dimensional memory device according to an exemplary embodiment of the present inventive concept.

FIG. 16 is a schematic block diagram illustrating an information processing system including a three-dimensional memory device according to an exemplary embodiment of the inventive concept.

Referring to FIG. 16, a flash memory device 1311 is mounted to an information processing system such as a mobile device or a desktop computer. The flash memory device 1311 includes a three-dimensional semiconductor memory device according to an exemplary embodiment of the inventive concept. The information processing system 1300 includes a flash memory system 1310, a modem 1320, a CPU 1330, a RAM 1340, and a user interface 1350, each of which is connected to a bus 1360. The flash memory system 1310 may be configured substantially identical to the above-mentioned memory system or flash memory system and may include the flash memory device 1311 as well as a memory controller 1312. The flash memory system 1310 may store data processed by the CPU 1330 or inputted from the outside. Here, the flash memory system 1310 may serve as a semiconductor disk device (SSD) and in this case, the information processing system 1300 may store a large amount of data in the flash memory system 1310. If the flash memory system 1310 is reliable, a high speed data exchange function of the information processing system 1300 may be performed using less circuitry for error correction. The information processing system 1300 may further include an application chipset, a camera image processor (CIS), and/or an input/output device.

According to an exemplary embodiment of the inventive concept, one pair of source and drain regions formed in a peripheral active pattern need not be arranged in an intersection line where a {111} plane of a silicon crystal structure in a semiconductor substrate meets a top surface of the semiconductor substrate. Accordingly, a current path between the source and drain regions may be avoided to be formed on the {111} plane, and thus leakage current may be reduced.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

The invention claimed is:

1. A method of manufacturing a semiconductor device, the method comprising:
   forming a device isolation layer defining a peripheral active pattern in a substrate;
   forming a peripheral gate electrode crossing the peripheral active pattern in a first direction;
   forming source and drain regions in the peripheral active pattern;
   forming a first stacked structure on a top surface of the substrate, wherein the first stacked structure includes a plurality of first gate electrodes vertically stacked on the top surface of the substrate, wherein the plurality of first gate electrodes are extended in a second direction different from the first direction, and
   forming a second stacked structure on the top surface of the substrate, wherein the second stacked structure includes a plurality of second gate electrodes vertically stacked on the top surface of the substrate, wherein the plurality of second gate electrodes are extended in the second direction,
   wherein the peripheral active pattern and the peripheral gate electrode are disposed between the first and second stacked structures, and
   wherein the second direction is neither perpendicular nor parallel to the first direction.

2. The method of claim 1, wherein the source and drain regions are arranged in a third direction different from the first and second directions,
   wherein an intersection line is extended at an angle with respect to the third direction, wherein the intersection line is a line where a {111} plane of the silicon crystal structure of the substrate and the top surface of the substrate meet.

3. The method of claim 2, wherein an orientation of the intersection line is a <110> direction of the silicon crystal structure.

4. The method of claim 2, wherein the angle is greater than about 0° and is smaller than or equal to about 45°.

5. The method of claim 2, wherein the substrate is a wafer having a flat zone of a {110} plane of the silicon crystal structure, and wherein the third direction is parallel to a <100> direction of the silicon crystal structure.

6. A method of manufacturing a semiconductor device, the method comprising:
   forming a device isolation layer defining a peripheral active pattern in a substrate;

forming a peripheral gate electrode crossing the peripheral active pattern in a first direction;
forming source and drain regions in the peripheral active pattern at both sides of the peripheral gate electrode; and
forming a stacked structure on a top surface of the substrate, wherein the stacked structure includes a plurality of gate electrodes vertically stacked on the top surface of the substrate, wherein the plurality of gate electrodes are extended in a second direction different from the first direction,
wherein the substrate is a wafer having a flat zone of a {110} plane of a silicon crystal structure,
wherein the second direction is parallel to the {110} plane of the silicon crystal structure,
wherein the source and drain regions are arranged in a third direction different from the first and second directions, and
wherein an intersection line is extended at an angle with respect to the third direction, wherein the intersection line is a line where a {111} plane of the silicon crystal structure of the substrate and the top surface of the substrate meet.

7. The method of claim 6, wherein an orientation of the intersection line is a <110> direction of the silicon crystal structure.

8. The method of claim 6, wherein the angle is greater than about 0° and is smaller than or equal to about 45°.

9. The method of claim 6, wherein the stacked structure is a first stacked structure and the plurality of gate electrodes are a plurality of first gate electrodes, the method further comprising:
forming a second stacked structure on the top surface of the substrate, wherein the second stacked structure includes a plurality of second gate electrodes vertically stacked on the top surface of the substrate, wherein the plurality of second gate electrodes are extended in the second direction,
wherein the peripheral active pattern and the peripheral gate electrode are disposed between the first and second stacked structures.

10. The method of claim 9, further comprising:
forming a first vertical structure penetrating the first plurality of gate electrodes, and
forming a second vertical structure penetrating the second plurality of gate electrodes,
wherein each of the first and second vertical structures is connected to the substrate.

11. The method of claim 6, further comprising:
forming a vertical structure penetrating the plurality of gate electrodes,
wherein the vertical structure is connected to the substrate.

12. A method of manufacturing a semiconductor device, the method comprising:
forming a peripheral active pattern on a substrate;
forming a peripheral gate electrode crossing the peripheral active pattern, the peripheral gate electrode extending in a first direction;
forming a first stacked structure on a top surface of the substrate, wherein the first stacked structure includes a plurality of first gate electrodes vertically stacked on the top surface of the substrate, wherein the plurality of first gate electrodes are extended in a second direction different from the first direction;
forming a first vertical structure penetrating the plurality of first gate electrodes;
forming a second stacked structure on the top surface of the substrate, wherein the second stacked structure includes a plurality of second gate electrodes vertically stacked on the top surface of the substrate, wherein the plurality of second gate electrodes are extended in the second direction; and
forming a second vertical structure penetrating the plurality of second gate electrodes,
wherein the peripheral active pattern and the peripheral gate electrode are disposed between the first and second stacked structures,
wherein the substrate is a wafer having a flat zone of a {110} plane of a silicon crystal structure,
wherein the second direction is parallel to the {110} plane of the silicon crystal structure, and
wherein the second direction is neither perpendicular nor parallel to the first direction.

13. The method of claim 12, wherein the first and second directions are parallel to the top surface of the substrate.

14. The method of claim 13, wherein each of the first and second vertical structures is extended in a direction perpendicular to the top surface of the substrate and is connected to the substrate.

15. The method of claim 12, further comprising:
forming source and drain regions in the peripheral active pattern at both sides of the peripheral gate electrode,
wherein the source and drain regions are arranged in a third direction different from the first and second directions, and
wherein an intersection line is extended at an angle with respect to the third direction, wherein the intersection line is a line where a {111} plane of the silicon crystal structure of the substrate and the top surface of the substrate meet.

16. The method of claim 15, wherein an orientation of the intersection line is a <110> direction of the silicon crystal structure.

17. The method of claim 15, wherein the angle is greater than about 0° and is smaller than or equal to about 45°.

18. The method of claim 15, wherein the third direction is parallel to a <100> direction of the silicon crystal structure.

19. The method of claim 1, wherein the substrate is a wafer having a flat zone of a {110} plane of a silicon crystal structure, and
wherein the second direction is parallel to the {110} plane of the silicon crystal structure.

* * * * *